US010109331B2

(12) United States Patent
Sato

(10) Patent No.: US 10,109,331 B2
(45) Date of Patent: Oct. 23, 2018

(54) MAGNETIC STORAGE DEVICE WITH A WIRING HAVING A FERROMAGNETIC LAYER

(71) Applicant: TOSHIBA MEMORY CORPORATION, Minato-ku, Tokyo (JP)

(72) Inventor: Motoyuki Sato, Seoul (KR)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 15/261,815

(22) Filed: Sep. 9, 2016

(65) Prior Publication Data

US 2017/0256298 A1 Sep. 7, 2017

Related U.S. Application Data

(60) Provisional application No. 62/301,996, filed on Mar. 1, 2016.

(51) Int. Cl.
G11C 11/16 (2006.01)

(52) U.S. Cl.
CPC .......... *G11C 11/161* (2013.01); *G11C 11/165* (2013.01); *G11C 11/1673* (2013.01); *G11C 11/1675* (2013.01); *H05K 999/99* (2013.01)

(58) Field of Classification Search
CPC ..... G11C 11/16; G11C 11/15; G11C 11/1675; G11C 11/1673; G11C 11/22

USPC ..... 365/48, 65, 66, 109, 117, 145, 158, 173, 365/189.2

See application file for complete search history.

(56) References Cited

U.S. PATENT DOCUMENTS

| 5,734,605 | A | * | 3/1998 | Zhu | B82Y 10/00 257/E21.665 |
|---|---|---|---|---|---|
| 2003/0185046 | A1 | * | 10/2003 | Nishiyama | B82Y 25/00 365/158 |
| 2006/0113587 | A1 | * | 6/2006 | Thies | G11C 7/02 257/328 |
| 2007/0097736 | A1 | | 5/2007 | Inokuchi et al. | |
| 2007/0285975 | A1 | | 12/2007 | Kawahara et al. | |
| 2008/0080233 | A1 | | 4/2008 | Hosotani et al. | |
| 2010/0091555 | A1 | * | 4/2010 | Fukami | B82Y 10/00 365/158 |
| 2016/0225429 | A1 | * | 8/2016 | Toh | G11C 11/1675 |

* cited by examiner

*Primary Examiner* — T Bui
*Assistant Examiner* — Alfredo Bermudez Lozada
(74) *Attorney, Agent, or Firm* — Holtz, Holtz & Volek PC

(57) ABSTRACT

According to one embodiment, a magnetic storage device includes memory cells, wherein each of the memory cell includes: a wiring including a first ferromagnetic layer and a first nonmagnetic layer disposed on the first ferromagnetic layer; a magnetoresistive effect element including a second ferromagnetic layer disposed on the first nonmagnetic layer, a third ferromagnetic layer, and a second nonmagnetic layer disposed between the second and the third ferromagnetic layer; a first transistor having a first terminal connected to the first ferromagnetic layer, and a second terminal connected to a source line; and a second transistor having a first terminal connected to the third ferromagnetic layer, and a second terminal connected to a bit line.

19 Claims, 20 Drawing Sheets

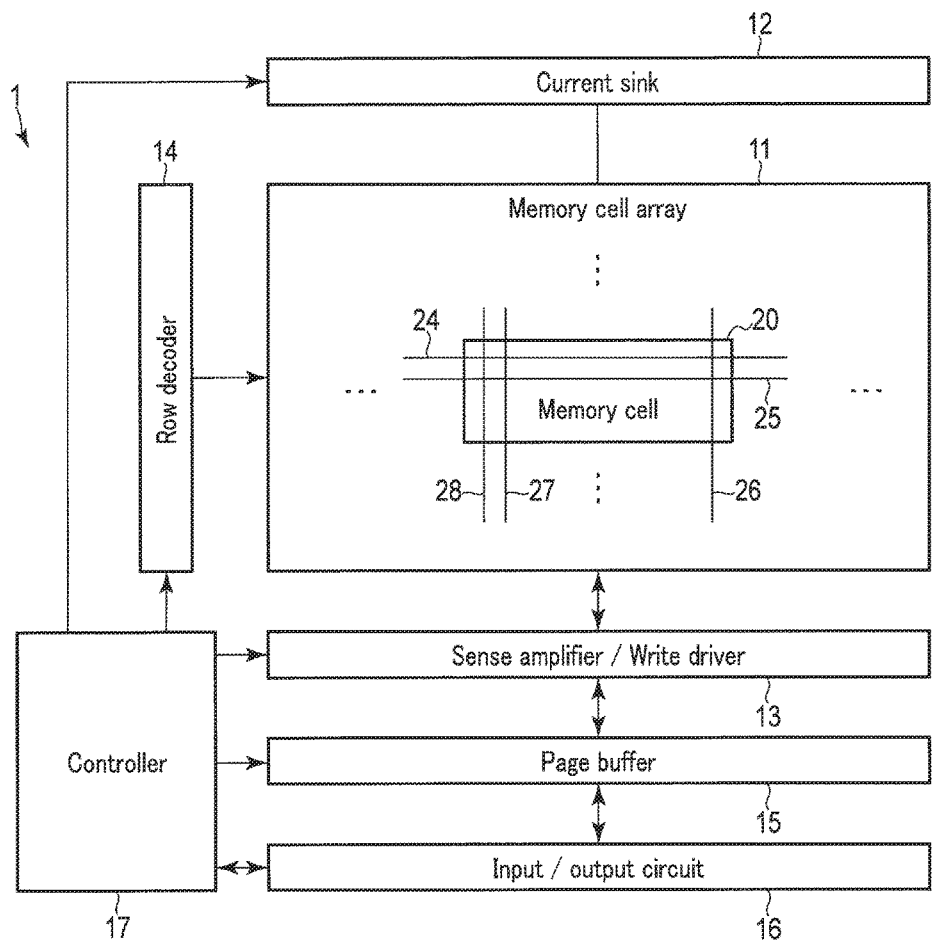
F I G. 1

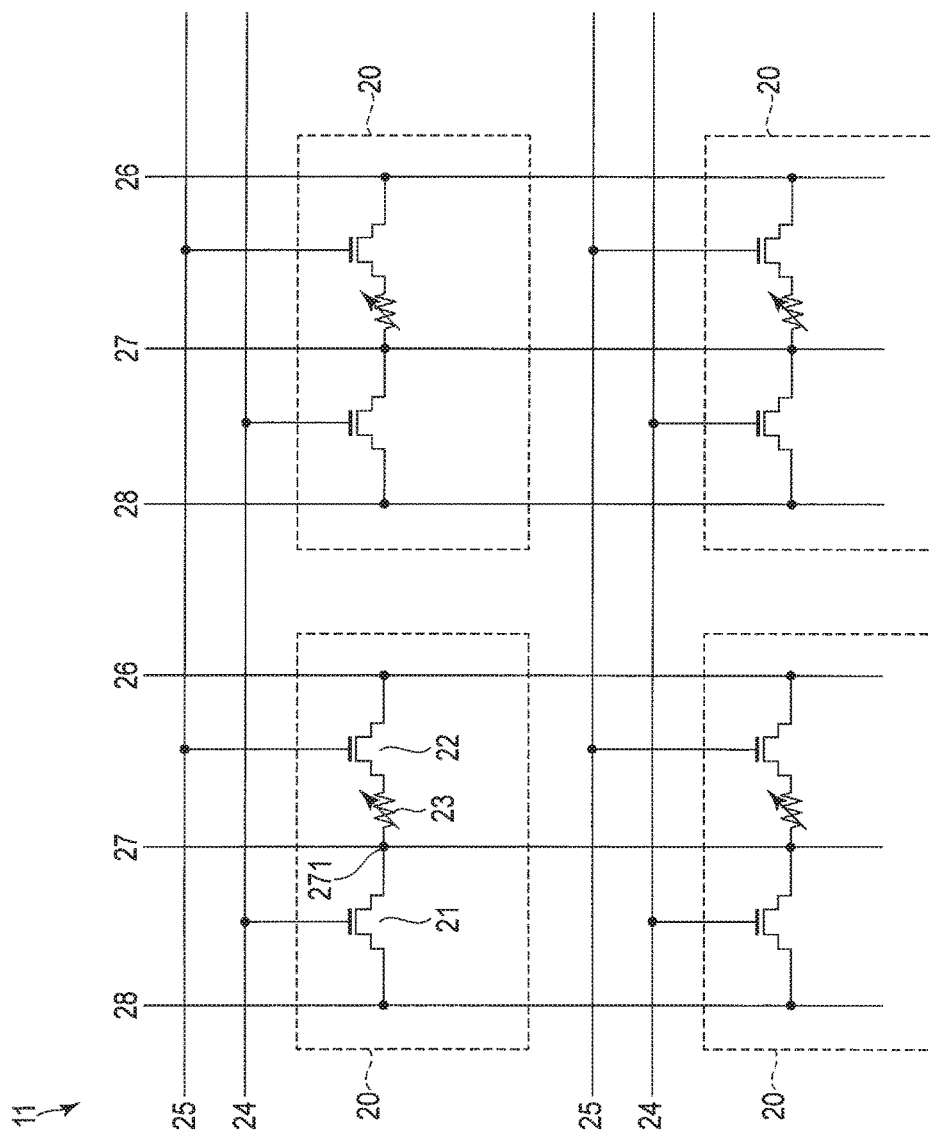
F I G. 2

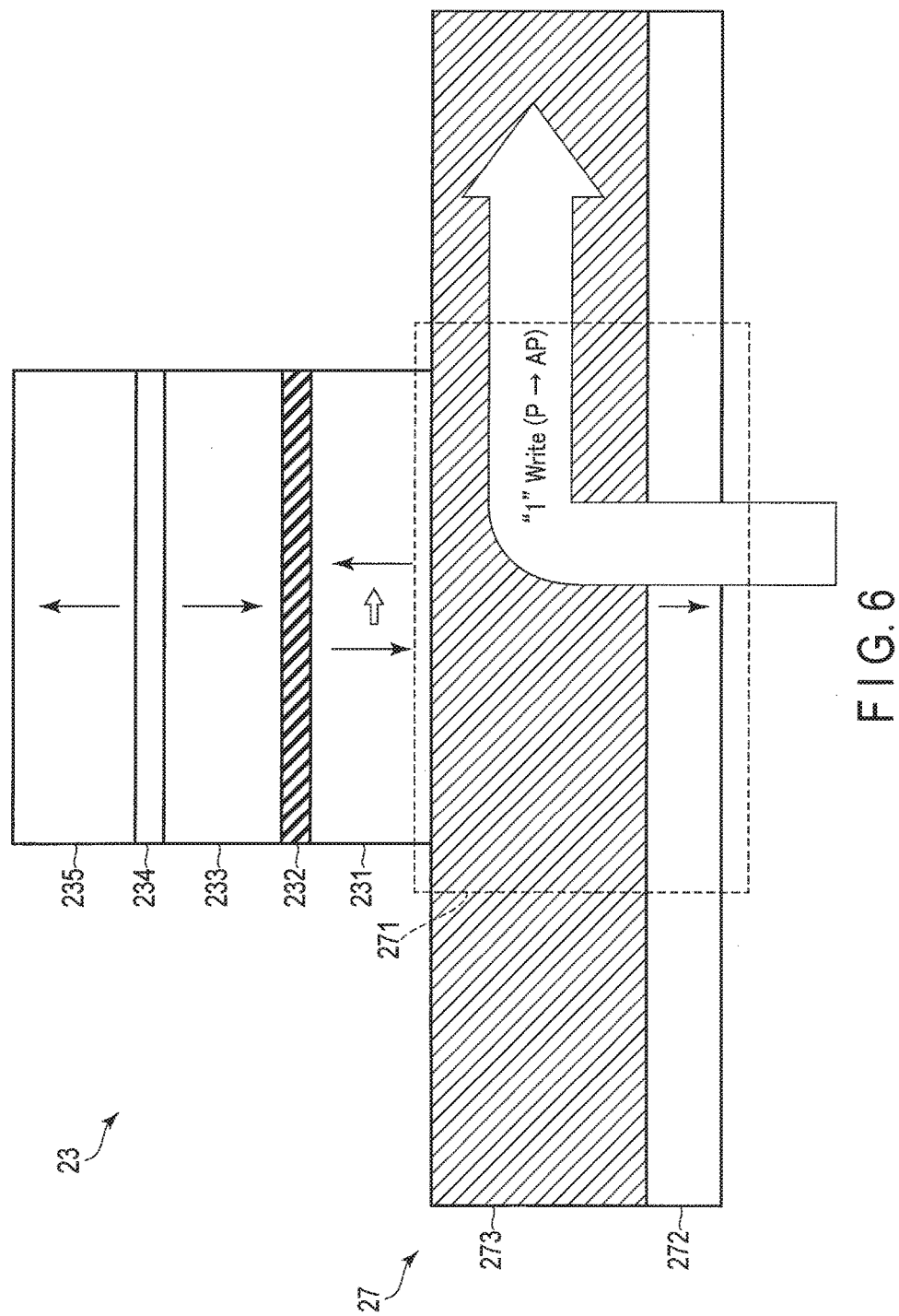
F I G. 6

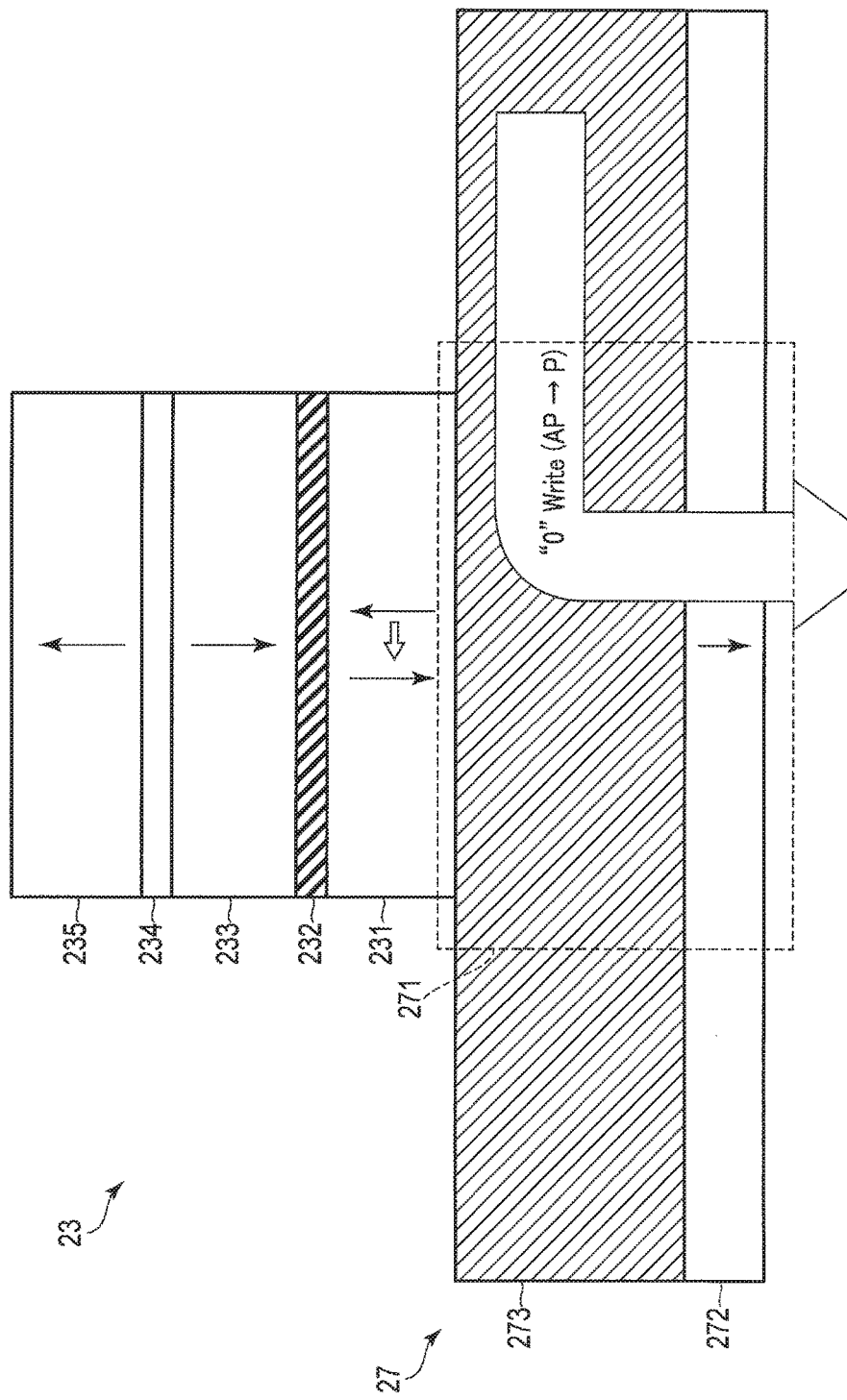
F I G. 8

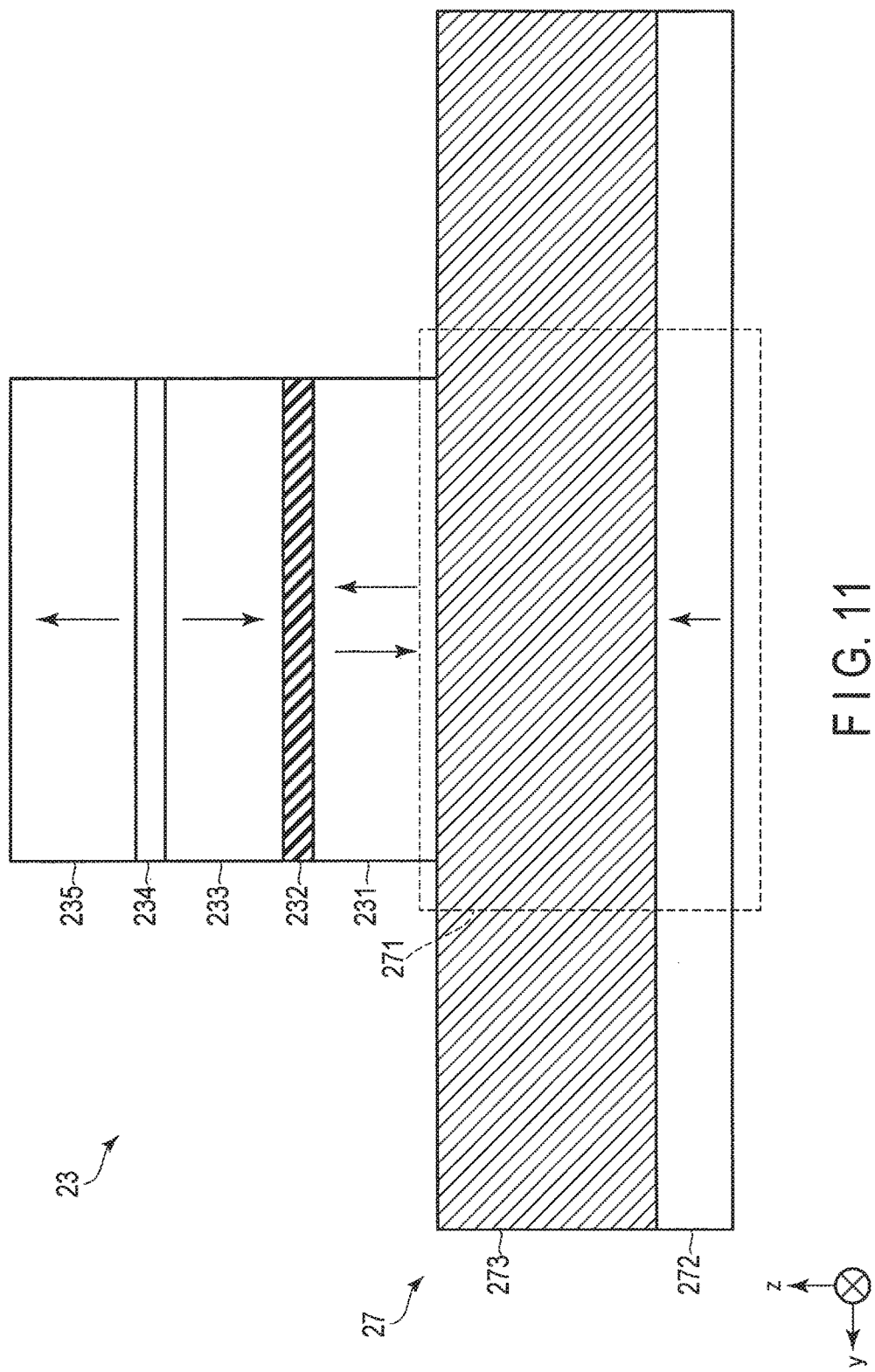
F I G. 11

MAGNETIC STORAGE DEVICE WITH A WIRING HAVING A FERROMAGNETIC LAYER

CROSS-REFERENCE TO RELATED APPLICATIONS

This application claims the benefit of U.S. Provisional Application No. 62/301,996, filed Mar. 1, 2016, the entire contents of which are incorporated herein by reference.

FIELD

Embodiments described herein relate generally to a magnetic storage device.

BACKGROUND

As a storage device included in a memory system, there is known a magnetic storage device (MRAM: Magnetoresistive Random Access Memory) which employs a magnetoresistive effect element as a memory element.

The magnetic storage device includes, for example, a magnetoresistive effect element as a memory element. The magnetoresistive effect element includes a storage layer with magnetization, a reference layer, and a tunnel barrier layer. The magnetoresistive effect element can store data semipermanently, for example, by setting the magnetization orientation of the storage layer to be either parallel or antiparallel to the magnetization orientation of the reference layer. The magnetic storage device sets the magnetization orientation of the storage layer, for example, by causing a magnetization reversal current to flow through the magnetoresistive effect element.

BRIEF DESCRIPTION OF THE DRAWINGS

FIG. 1 is a block diagram illustrating a configuration example of a magnetic storage device according to a first embodiment.

FIG. 2 is a circuit diagram illustrating a configuration example of a memory cell array of the magnetic storage device according to the first embodiment.

FIG. 6 is a schematic view illustrating an operation at write time of the magnetic storage device according to the first embodiment.

FIG. 8 is a schematic view illustrating an operation at write time of the magnetic storage device according to the first embodiment.

FIG. 11 is a cross-sectional view illustrating a configuration example of a magnetoresistive effect element and a second bit line of a magnetic storage device according to a second embodiment.

DETAILED DESCRIPTION

Figure 3:
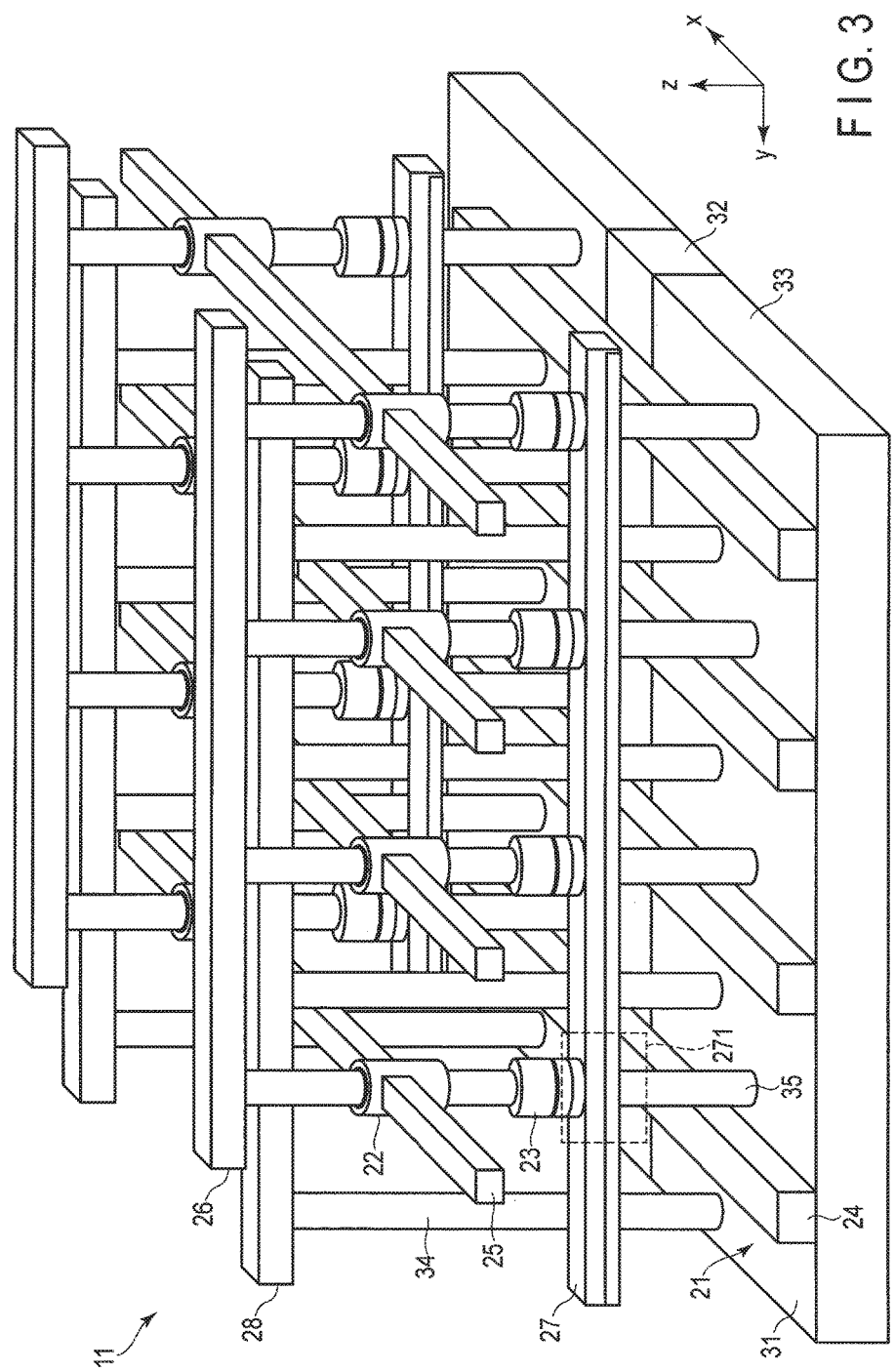
FIG. 3 is a perspective view illustrating a configuration example of a memory cell of the magnetic storage device according to the first embodiment.

In general, according to one embodiment, a magnetic storage device comprising memory cells, wherein each of the memory cells includes: a wiring including a first ferromagnetic layer and a first nonmagnetic layer disposed on the first ferromagnetic layer; a magnetoresistive effect element including a second ferromagnetic layer disposed on the first nonmagnetic layer, a third ferromagnetic layer, and a second nonmagnetic layer disposed between the second ferromagnetic layer and the third ferromagnetic layer; a first transistor having a first terminal electrically connected to the first ferromagnetic layer, and a second terminal electrically connected to a source line; and a second transistor having a first terminal electrically connected to the third ferromagnetic layer, and a second terminal electrically connected to a bit line.

Hereinafter, embodiments will be described with reference to the accompanying drawings. In the description below, structural elements having substantially the same functions and structures are denoted by like reference signs, and an overlapping description is given only where necessary. In addition, embodiments to be described below illustrate, by way of example, devices or methods for embodying technical concepts of the embodiments, and the technical concepts of the embodiments do not specifically restrict the material, shape, structure, arrangement, etc. of structural components to those described below. Various changes may be made in the technical concepts of the embodiments within the scope of the claims.

1. First Embodiment

A magnetic storage device according to a first embodiment is described.

1.1. Re: Configuration
1.1.1. Re: Configuration of Magnetic Storage Device To begin with, the configuration of the magnetic storage device according to the first embodiment is described. The magnetic storage device according to the first embodiment is a magnetic storage device by a vertical magnetization method, which uses, for example, a magnetoresistive effect element (MTJ (Magnetic Tunnel Junction) element) as a memory element. FIG. 1 is a block diagram illustrating the configuration of the magnetic storage device according to the first embodiment.

A magnetic storage device 1 includes a memory cell array 11, a current sink 12, a sense amplifier and write driver (SA/WD) 13, a row decoder 14, a page buffer 15, an input/output circuit 16, and a controller 17.

As illustrated in the Figure, the memory cell array 11 includes a plurality of memory cells 20 which are associated with rows and columns. In addition, the memory cells 20 on an identical row are connected to an identical first word line 24 and an identical second word line 25, and the memory cells 20 on an identical column are connected to an identical first bit line 26, an identical second bit line 27, and an identical source line 28.

The current sink 12 is connected to the first bit line 26, second bit line 27 and source line 28. The current sink 12 sets the first bit line 26, second bit line 27 or source line 28 at a ground potential in operations such as data write and read.

The SA/WD 13 is connected to the first bit line 26, second bit line 27 and source line 28. The SA/WD 13 supplies an electric current to the memory cell 20 of an operation target via the first bit line 26 or second bit line 27, and the source line 28, and executes data write to the memory cell 20. In addition, the SA/WD 13 supplies an electric current to the memory cell 20 of the operation target via the first bit line 26 and the source line 28, and executes data read from the memory cell 20. To be more specific, the write driver of the SA/WD 13 executes data write to the memory cell 20, and the sense amplifier of the SA/WD 13 executes data read from the memory cell 20.

The row decoder 14 is connected to the memory cell array 11 via the first word line 24 and second word line 25. The row decoder 14 decodes a row address which designates the row direction of the memory cell array 11. In addition, the row decoder 14 selects the first word line 24 and second word line 25 in accordance with the decoded result, and applies a voltage which is necessary for operations such as data write and read.

The page buffer 15 temporarily stores, in units of data called "page", data which is to be written in the memory cell array 11, and data which was read from the memory cell array 11.

The input/output circuit 16 transmits various signals, which were received from the outside, to the controller 17 and page buffer 15, and transmits various pieces of information from the controller 17 and page buffer 15 to the outside.

The controller 17 is connected to the current sink 12, SA/WD 13, row decoder 14, page buffer 15, and input/output circuit 16. The controller 17 controls the current sink 12, SA/WD 13, row decoder 14 and page buffer 15 in accordance with various signals which the input/output circuit 16 received from the outside.

1.1.2. Re: Configuration of Memory Cell Array

Next, the configuration of the memory cell array of the magnetic storage device according to the first embodiment is described with reference to FIG. 2. FIG. 2 is a circuit diagram illustrating the configuration of the memory cell array 11 of the magnetic storage device 1 according to the first embodiment. As illustrated in the Figure, the memory cell 20 includes a first transistor 21, a second transistor 22, a magnetoresistive effect element 23, and a second bit line 27 functioning as a wiring. The second bit line 27 includes a multilayer portion 271.

The memory cell 20 is connected to the source line 28 at one terminal of the first transistor 21, and is connected to the first bit line 26 at the other terminal of the second transistor 22. The memory cell 20 is connected to the second bit line 27 at the multilayer portion 271. In addition, the memory cell 20 is connected to the first word line 24 at the gate of the first transistor 21, and is connected to the second word line 25 at the gate of the second transistor 22.

The first transistor 21 and second transistor 22 are provided as switches which control supply and stop of an electric current when data write and data read are executed to and from the magnetoresistive effect element 23. To be more specific, the first transistor 21 has one terminal connected to the source line 28, and has the other terminal connected to the multilayer portion 271 of the second bit line 27. By the first word line 24 being selected, the first transistor 21 functions as a current path between the source line 28 and the multilayer portion 271 of the second bit line 27. The second transistor 22 has one terminal connected to the magnetoresistive effect element 23, and has the other terminal connected to the first bit line 26. By the second word line 25 being selected, the second transistor 22 functions as a current path between the magnetoresistive effect element 23 and the second bit line 27.

The magnetoresistive effect element 23 has one terminal connected to the multilayer portion 271 of the second bit line 27, and has the other terminal connected to the one terminal of the second transistor 22. The resistance value of the magnetoresistive effect element 23 can be switched between a low resistance state and a high resistance state by an electric current whose path is controlled by the first transistor 21 and second transistor 22. Data can be written to the magnetoresistive effect element 23 by a change of the resistance state of the magnetoresistive effect element 23, and the magnetoresistive effect element 23 functions as a memory element to which written data can be stored non-volatilely, and from which the written data can be read.

Subsequently, referring to FIG. 3, a description is given of a three-dimensional multilayer configuration of the memory cell array 11 of the magnetic storage device 1 according to the first embodiment. FIG. 3 is a perspective view which schematically illustrates the configuration of the memory cell array 11 of the magnetic storage device 1 according to the first embodiment. Incidentally, in the description below, an xy plane is defined as a plane parallel to the surface of a semiconductor substrate, and an axis perpendicular to the xy plane is defined as a z axis. An x axis and a y axis are defined as axes which are perpendicular to each other in the xy plane.

As illustrated in the Figure, the memory cell array 11 is provided on a semiconductor substrate 31. A plurality of device formation regions 33 are formed in the semiconductor substrate 31 by an STI (Shallow Trench Isolation) 32 which is formed in the y direction. The plural device formation regions 33 are arranged in the x direction. In addition, a plurality of first word lines 24 are disposed along the x direction on the semiconductor substrate 31 via an insulation film (not shown). The plural first word lines 24 are arranged in the y direction. In each device formation region 33, a plurality of first transistors 21 are formed along the y direction. Each first transistor 21 includes a pair of source/drain regions (not shown) formed on a surface of the semiconductor substrate 31 at both ends of one first word line 24. In the meantime, the mutually neighboring source/drain regions of the plural first transistors 21, which are arranged in the y direction, are electrically isolated. The mutually neighboring source/drain regions are electrically isolated by, for example, an STI (not shown) extending in the x direction between the neighboring source region and drain region or a dummy wiring (not shown) buried in the semiconductor region 31. The plural first transistors 21, which are arranged in the x direction via the STI 32, are commonly connected to the first word line 24. One terminal of each of the first transistors 21, which are arranged in the y direction in the identical device formation region 33, is commonly connected to the identical source line 28 via a source line contact 34, and the other terminal of each of the first transistors 21 is commonly connected to the identical second bit line 27 via a bit line contact 35. In the meantime, the other terminal of the first transistor 21 is connected to a lower surface of the multilayer portion 271 of the second bit line 27.

A plurality of magnetoresistive effect elements 23 are disposed on an upper surface of the multilayer portion 271 of the second bit line 27. One terminal of each of the magnetoresistive effect elements 23 provided along the y direction is commonly connected to the identical second bit line 27. The second transistor 22 is disposed on an upper surface of the magnetoresistive effect element 23 via a conductive film. The second transistor 22 has a surrounding gate structure in which a gate electrode is disposed via a gate insulation film on an outer side surface of a channel region which is deposited in the z direction. It is desirable to use, for the channel region, a conductive oxide film which does not require a high-temperature process which may affect the performance of the magnetoresistive effect element 23 at a time of film formation. As an example of the conductive oxide film, IGZO (Indium Gallium Zinc Oxide) or zinc oxide, for instance, is applicable. The gate electrode of each of the second transistors 22, which are disposed along the x direction, is commonly connected to the identical second word line 25. A source line 28 is positioned above the second word line 25. The source line 28 may be disposed below the second word line 25. The second transistors 22, which are disposed along the y direction, are commonly connected to the identical first bit line 26 via a conductive film. The first bit line 26 is positioned above the source line 28.

In the meantime, in FIG. 3, the magnetoresistive effect elements 23 are directly disposed on the upper surface of the second bit line 27. However, the disposition is not limited to this, and the magnetoresistive effect elements 23 may be connected to the multilayer portion 271 of the second bit line 27 via a contact. In this case, the distance between the magnetoresistive effect element 23 and the multilayer portion 271 of the second bit line 27 should preferably be, for example, 10 nanometers or less, in order that the absorption of spins accumulated the multilayer portion 271 may be effectively executed in the magnetoresistive effect element 23.

1.1.3. Re: Configuration of Magnetoresistive Effect Element and Second Bit Line

Figure 4:
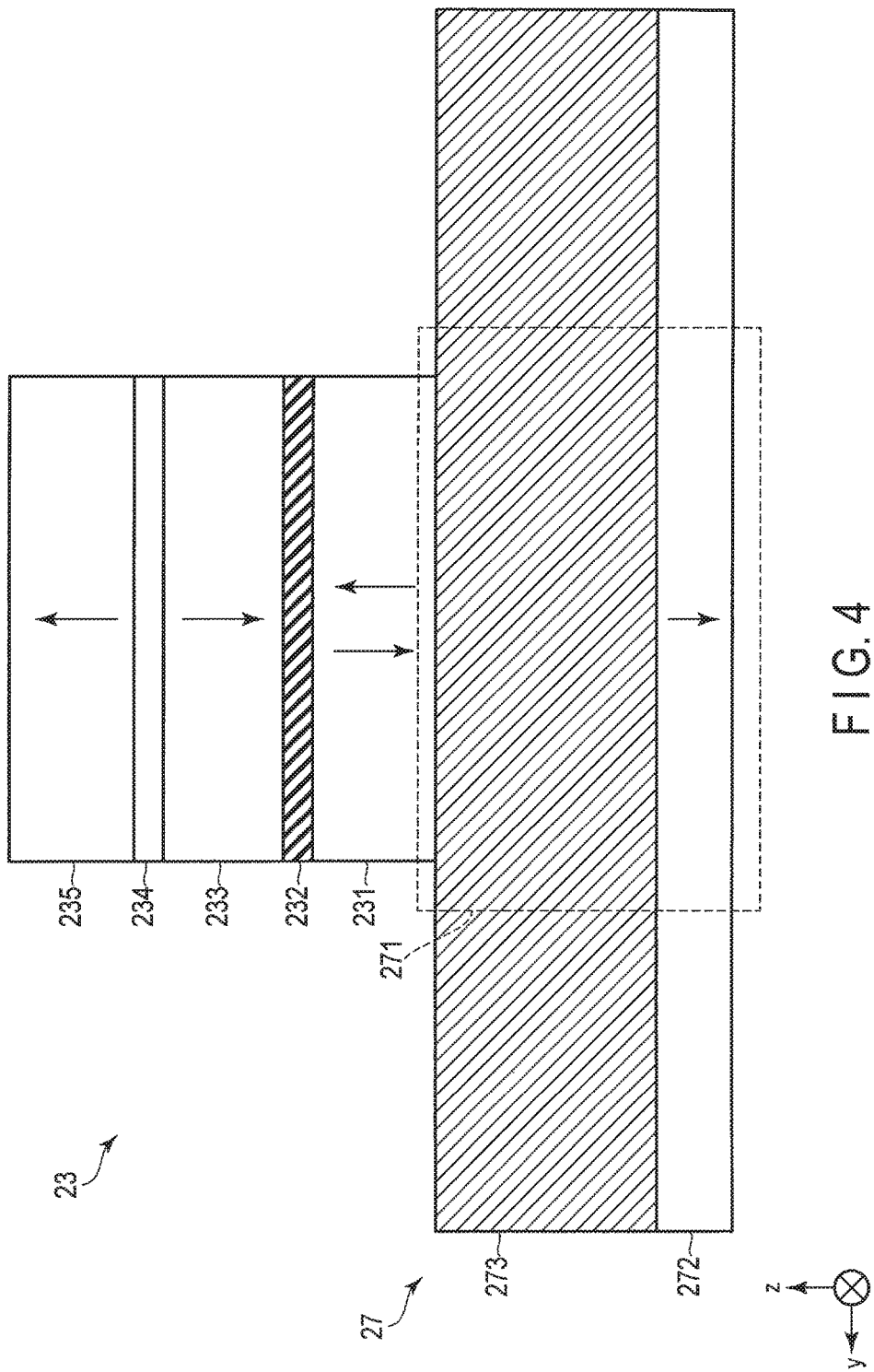
FIG. 4 is a cross-sectional view illustrating a configuration example of a magnetoresistive effect element and a second bit line of the magnetic storage device according to the first embodiment.

Next, referring to FIG. 4, a description is given of the configuration of the magnetoresistive effect element and second bit line of the magnetic storage device according to the first embodiment. FIG. 4 is a cross-sectional view illustrating a yz cross section of the magnetoresistive effect element 23 and second bit line 27 of the magnetic storage device 1 according to the first embodiment. The magnetoresistive effect element 23 takes different resistance states in accordance with the direction of an electric current flowing in the z direction in the multilayer portion 271. A phenomenon, in which different resistances are exhibited in accordance with states, is called a magnetoresistive effect.

As illustrated in the Figure, the second bit line 27 includes a multilayer portion 271 in which a polarizing layer 272 functioning as a first ferromagnetic layer and a shunt layer 273 functioning as a first nonmagnetic layer are stacked. In addition, the magnetoresistive effect element 23 includes a storage layer 231 functioning as a second ferromagnetic layer, a tunnel barrier layer 232 functioning as a second nonmagnetic layer, a reference layer 233 functioning as a third ferromagnetic layer, a spacer layer 234, and a shift cancelling layer 235.

Incidentally, as illustrated in FIG. 4, the polarizing layer 272 and shunt layer 273 may be provided over the second bit line 27. In other words, the second bit line 27 may be a wiring in which the polarizing layer 272 and shunt layer 273 are stacked and provided. The multilayer portion 271 includes that region of the second bit line 27, which is located immediately under the magnetoresistive effect element 23.

The polarizing layer 272 of the multilayer portion 271 is connected to the first transistor 21 side via the bit line contact 35. The polarizing layer 272 is a ferromagnetic layer having a magnetization easy axis direction along the z direction, that is, a direction perpendicular to the multilayer surface of the multilayer portion 271, and includes ferromagnetic material such as cobalt (Co), iron (Fe), or nickel (Ni). The polarizing layer 272 includes, for example, cobalt-iron (CoFe). The polarizing layer 272 is stacked on an upper surface of an antiferromagnetic layer (not shown), and thereby the magnetization orientation of the polarizing layer 272 is fixed. The antiferromagnetic layer includes, for example, platinum-manganese (PtMn). In the meantime, "the magnetization orientation is fixed" means that the magnetization orientation is not changed by an electric current of a magnitude which can reverse the magnetization orientation of the storage layer 231. In FIG. 4, the magnetization orientation of the polarizing layer 272 is set to be parallel to the magnetization orientation of the reference layer 233. By an electric current being passed between the polarizing layer 272 and shunt layer 273, the polarizing layer 272 accumulates spin-polarized electrons in the shunt layer 273.

Of the multilayer portion 271, the shunt layer 273 is connected to the storage layer 231 side of the magnetoresistive effect element 23. The shunt layer 273 is a nonmagnetic layer having a high conductivity, and includes metal which is generally used as wiring. The shunt layer 273 includes, for example, copper (Cu), aluminum (Al), or tungsten (W). The shunt layer 273 functions as a spin accumulation region which accumulates spin-polarized electrons, by an electric current being passed between the polarizing layer 272 and shunt layer 273. The shunt layer 273, in which spin-polarized electrons are accumulated, causes a spin flow to occur between the shunt layer 273 and the storage layer 231, and causes the storage layer 231 to absorb the accumulated spin-polarized electrons.

The storage layer 231 of the magnetoresistive effect element 23 is disposed on the upper surface of the shunt layer 273. The tunnel barrier layer 232, reference layer 233, spacer layer 234 and shift cancelling layer 235 are successively stacked on the upper surface of the storage layer 231. Specifically, the magnetoresistive effect element 23 has a bottom free-type configuration in which the reference layer 233 is stacked above the storage layer 321. In addition, the storage layer 231, tunnel barrier layer 232 and reference layer 233 constitute a magnetic tunnel junction (MTJ). The magnetoresistive effect element 23 is a perpendicular magnetization type MTJ element in which the magnetization orientations of the storage layer 21 and reference layer 233 are perpendicular to the film plane.

The storage layer 231 is a ferromagnetic layer having a magnetization easy axis direction along the z direction, that is, a direction perpendicular to the film plane, and includes, for example, cobalt-iron (CoFe). The storage layer 231 has a magnetization orientation toward either the second bit line 27 side or the reference layer 233 side. The magnetization orientation of the storage layer 231 is set to be more easily reversed than the magnetization orientations of the reference layer 233 and polarizing layer 272.

The tunnel barrier layer 232 is a nonmagnetic insulation film, and includes, for example, magnesium oxide (MgO).

The reference layer 233 is a ferromagnetic layer having a magnetization easy axis direction along the z direction, and includes, for example, cobalt-iron (CoFe). The magnetization orientation of the reference layer 233 is fixed to be parallel to the magnetization orientation of the polarizing layer 272.

The spacer layer 234 is a nonmagnetic layer, and includes, for example, a nonmagnetic metal such as ruthenium (Ru). The spacer layer 234 functions as an antiparallel coupling element (AFM: Anti-Ferromagnetic Material) by which the reference layer 233 and shift cancelling layer 235 are coupled such that their magnetization orientations are antiparallel.

The shift cancelling layer 235 is a ferromagnetic layer having a magnetization easy axis direction along the z direction, and includes, for example, cobalt-iron (CoFe). The magnetization orientation of the shift cancelling layer 235 is fixed to be antiparallel to the magnetization orientation of the reference layer 233 by the spacer layer 234. The shift cancelling layer 235 has a function of suppressing the influence of a stray field from the reference layer 233 upon the storage layer 231.

In the meantime, in the first embodiment, a method is adopted in which the magnetization orientation of the storage layer 231 is controlled without directly passing a write current through the magnetoresistive effect element 23 at a time of write. To be more specific, the magnetoresistive effect element 23 reverses the magnetization orientation of the storage layer 231 by spins accumulated in the shunt layer 273 by an electric current flowing between the polarizing layer 272 and shunt layer 273 of the multilayer portion 271. Thereby, it is possible to prevent an electric current with a magnitude, which may cause dielectric breakdown, from flowing through the tunnel barrier layer 232.

Thus, if a write current in a direction from the polarizing layer 272 toward the shunt layer 273, is caused to flow through the multilayer portion 271, electrons having spins polarized in a direction antiparallel to the magnetization orientation of the polarizing layer 272 are accumulated in the vicinity of the current path in the shunt layer 273. The storage layer 231 absorbs the accumulated polarized spins, and reverses the magnetization orientation to the direction of the absorbed spins. Since the magnetization orientation of the reference layer 233 is parallel to the magnetization orientation of the polarizing layer 272, the reversed magnetization orientation of the storage layer 231 becomes antiparallel to the magnetization orientation of the reference layer 233. In this case, the resistance value of the magnetoresistive effect element 23 becomes highest, and the magnetoresistive effect element 23 is set in the high resistance state. This high resistance state is defined as data "1", for example.

In addition, if a write current in a direction from the shunt layer 273 toward the polarizing layer 272 is caused to flow through the multilayer portion 271, electrons having spins polarized in a direction parallel to the magnetization orientation of the polarizing layer 272 are accumulated in the vicinity of the current path in the shunt layer 273. The storage layer 231 absorbs the accumulated polarized spins, and reverses the magnetization orientation to the direction of the absorbed spins. Since the magnetization orientation of the reference layer 233 is parallel to the magnetization orientation of the polarizing layer 272, the reversed magnetization orientation of the storage layer 231 becomes parallel to the magnetization orientation of the reference layer 233. In this case, the resistance value of the magnetoresistive effect element 23 becomes lowest, and the magnetoresistive effect element 23 is set in the low resistance state. This low resistance state is defined as data "0", for example.

1.2. Re: Operations

Next, the operation of the magnetic storage device according to the first embodiment is described.

1.2.1. Re: Write Operation

Figure 5:
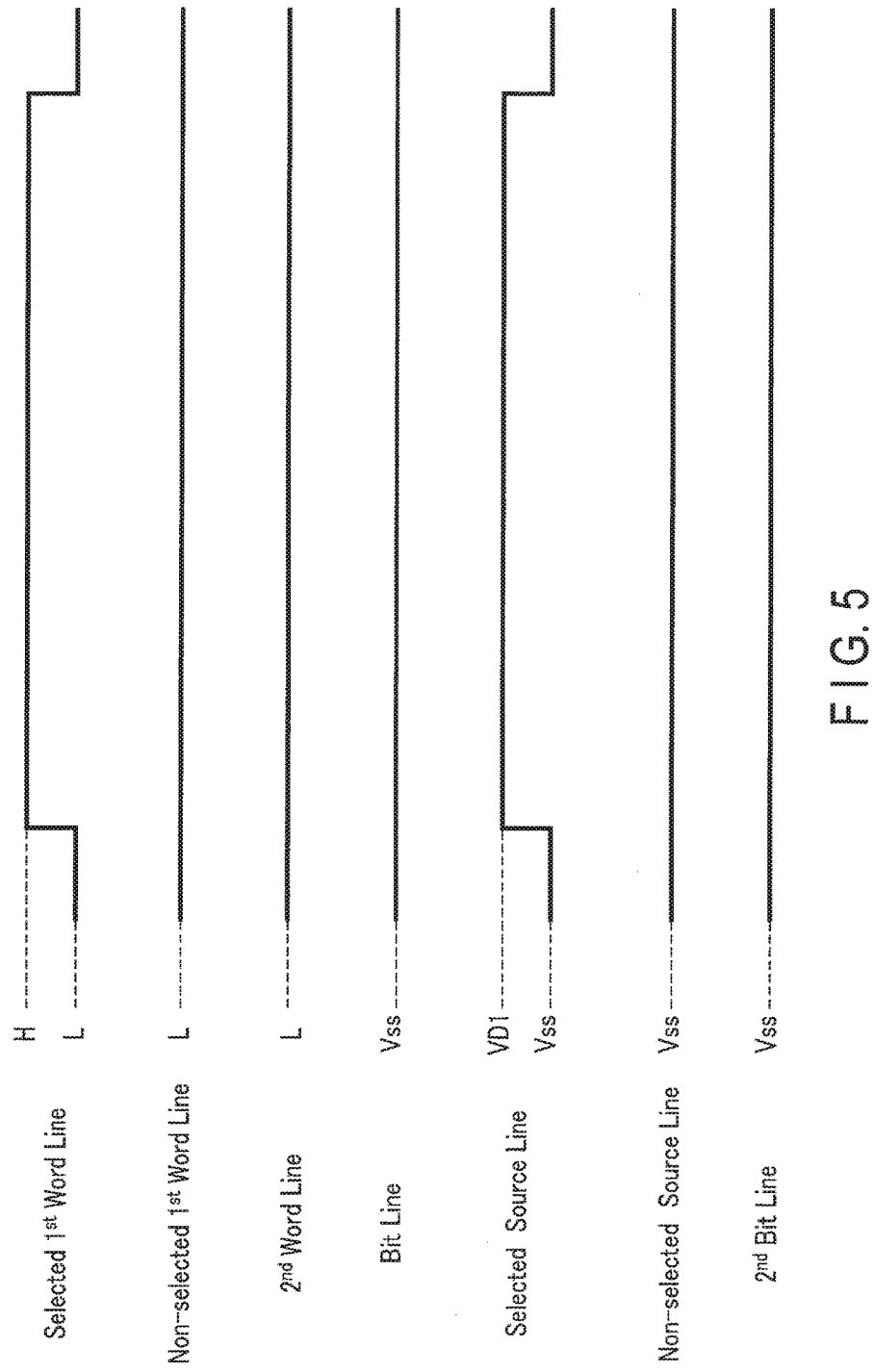
FIG. 5 is a waveform chart illustrating an operation at write time of the magnetic storage device according to the first embodiment.
Figure 7:
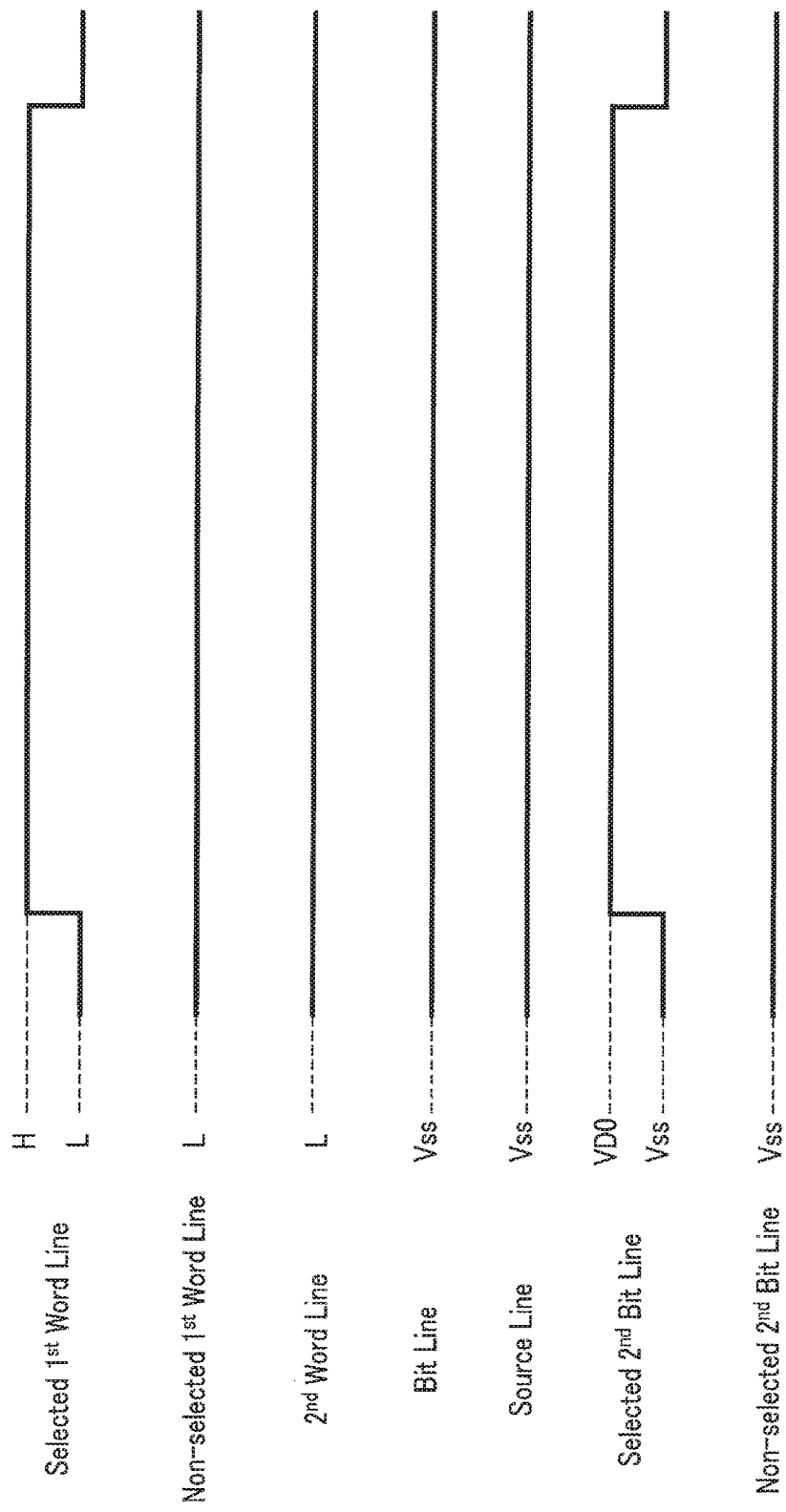
FIG. 7 is a waveform chart illustrating an operation at write time of the magnetic storage device according to the first embodiment.

To begin with, the write operation of the magnetic storage device 1 according to the first embodiment is described with reference to FIG. 5 to FIG. 8. FIG. 5 and FIG. 7 are waveform charts for describing operations at write time of the magnetic storage device 1 according to the first embodiment. FIG. 6 and FIG. 8 are schematic views for describing current paths at write time of the magnetic storage device 1 according to the first embodiment.

To start with, referring to FIG. 5 and FIG. 6, a case of writing data "1" to the memory cell 20 is described.

Upon receiving a write command which instructs data write, the input/output circuit 16 transfers a write signal which instructs data write and an address of a write destination to the controller 17. In addition, the input/output circuit 16 sends data "1", which is to be written, to the page buffer 15. Of the address of the write destination, the controller 17 transfers a row address to the row decoder 14, and a column address to the SA/WD 13.

The row decoder 14 selects the memory cell 20 of the row of the write target in accordance with the decoded result of the row address, and applies a voltage which is necessary for the operation of data write. Specifically, the row decoder 14 selects a first word line 24 corresponding to the memory cell 20 of the write target, and raises the potential of the first word line 24 from a low potential L to a high potential H, thereby turning on the first transistor 21. The non-selected first word line 24 is set at a low potential L. In the meantime, when data "1" is written, the second word line 25 is not selected, and is set to remain at a low potential L.

The SA/WD 13 selects the memory cell 20 of the column of the write target in accordance with the decoded result of the column address, and writes the data, which is stored in the page buffer 15, to the selected memory cell 20, based on the write signal. Specifically, the SA/WD 13 selects the source line 28 which is connected to the memory cell 20 of the write target, sets the source line 28 at a potential VD1, and sets the second bit line 27 at a ground potential Vss. In addition, the non-selected source line 28 is set at a ground potential Vss. In the meantime, when data "1" is written, the first bit line 26 is not selected, and is set to remain at a ground potential Vss.

Thereby, in the selected memory cell 20, an electric current flows from the source line 28 toward the second bit line 27 via the multilayer portion 271. In other words, in the selected memory cell 20, electrons flow from the shunt layer 273 toward the polarizing layer 272 in the multilayer portion 271, without intervention of the magnetoresistive effect element 23. Electrons, which are spin-polarized in a direction antiparallel to the magnetization orientation of the polarizing layer 272, are accumulated in the shunt layer 273 and absorbed in the storage layer 231. The magnetization orientation of the storage layer 231 is reversed to the direction which is antiparallel to the magnetization orientation of the polarizing layer 272. Since the reversed magnetization orientation of the storage layer 231 is antiparallel to the magnetization orientation of the reference layer 233, data "1" is written to the magnetoresistive effect element 23 in the selected memory cell 20. The potential VD1 has such a value as to pass an electric current for writing data "1" to the memory cell 20 in this manner. In addition, the high potential H has such a value as to pass an electric current for turning on the first transistor 21 and second transistor 22 in this manner, and the low potential L has such a value as to pass an electric current for turning off the first transistor 21 and second transistor 22.

By the above, the write operation of data "1" is completed.

Next, referring to FIG. 7 and FIG. 8, a case of writing data "0" to the memory cell 20 is described. When data "0" is written, an electric current in a direction opposite to the case of writing data "1" flows through the memory cell 20.

Upon receiving a write command which instructs data write, the input/output circuit 16 transfers a write signal which instructs data write and an address of a write destination to the controller 17. In addition, the input/output circuit 16 sends data "0", which is to be written, to the page buffer 15. Of the address of the write destination, the controller 17 transfers a row address to the row decoder 14, and a column address to the SA/WD 13.

The row decoder 14 selects the memory cell 20 of the row of the write target in accordance with the decoded result of the row address, and applies a voltage which is necessary for the operation of data write. Specifically, the row decoder 14 selects a first word line 24 corresponding to the memory cell 20 of the write target, and raises the potential of the first word line 24 from a low potential L to a high potential H, thereby turning on the first transistor 21. The non-selected first word line 24 is set at a low potential L. In the meantime, when data "0" is written, the second word line 25 is not selected, and is set to remain at a low potential L.

The SA/WD 13 selects the memory cell 20 of the column of the write target in accordance with the decoded result of the column address, and writes the data, which is stored in the page buffer 15, to the selected memory cell 20, based on the write signal. Specifically, the SA/WD 13 selects the second bit line 27 which is connected to the memory cell 20 of the write target, sets the second bit line 27 at a potential VD0, and sets the source line 28 at a ground potential Vss. The non-selected second bit line 27 is set at a ground potential Vss. In the meantime, when data "0" is written, the first bit line 26 is not selected, and is set to remain at a ground potential Vss.

Thereby, in the selected memory cell 20, an electric current flows from the second bit line 27 toward the source line 28 via the multilayer portion 271. In other words, in the selected memory cell 20, electrons flow from the polarizing layer 272 toward the shunt layer 273 in the multilayer portion 271, without intervention of the magnetoresistive effect element 23. Electrons, which are spin-polarized in a direction parallel to the magnetization orientation of the polarizing layer 272, are accumulated in the shunt layer 273 and absorbed in the storage layer 231. The magnetization orientation of the storage layer 231 is reversed to the direction which is parallel to the magnetization orientation of the polarizing layer 272. Since the reversed magnetization orientation of the storage layer 231 is parallel to the magnetization orientation of the reference layer 233, data "0" is written to the magnetoresistive effect element 23 in the selected memory cell 20. The potential VD0 has such a value as to pass an electric current for writing data "0" to the memory cell 20 in this manner.

By the above, the write operation of data "0" is completed.

1.2.2. Re: Read Operation

Figure 9:
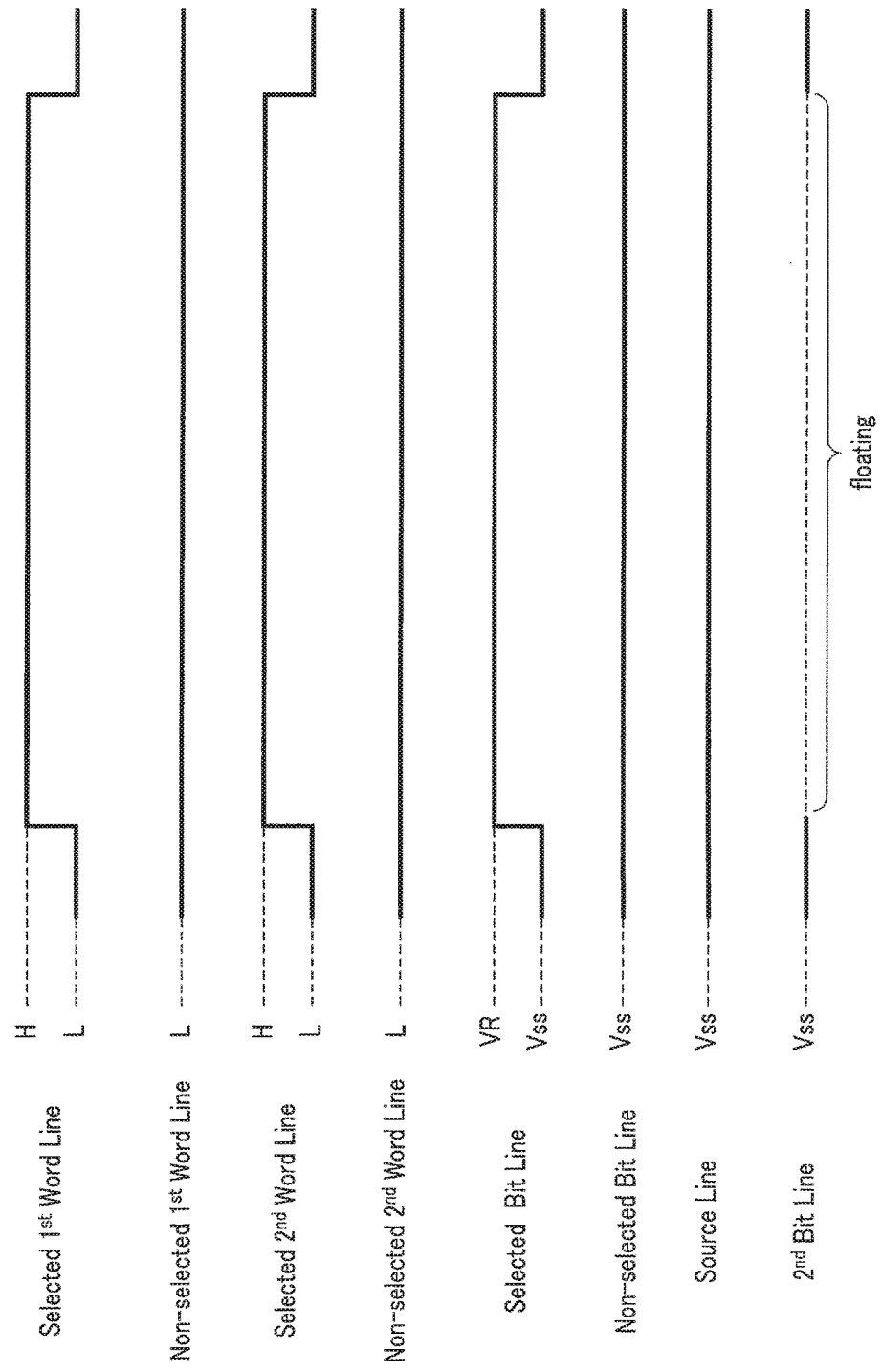
FIG. 9 is a waveform chart illustrating an operation at read time of the magnetic storage device according to the first embodiment.
Figure 10:
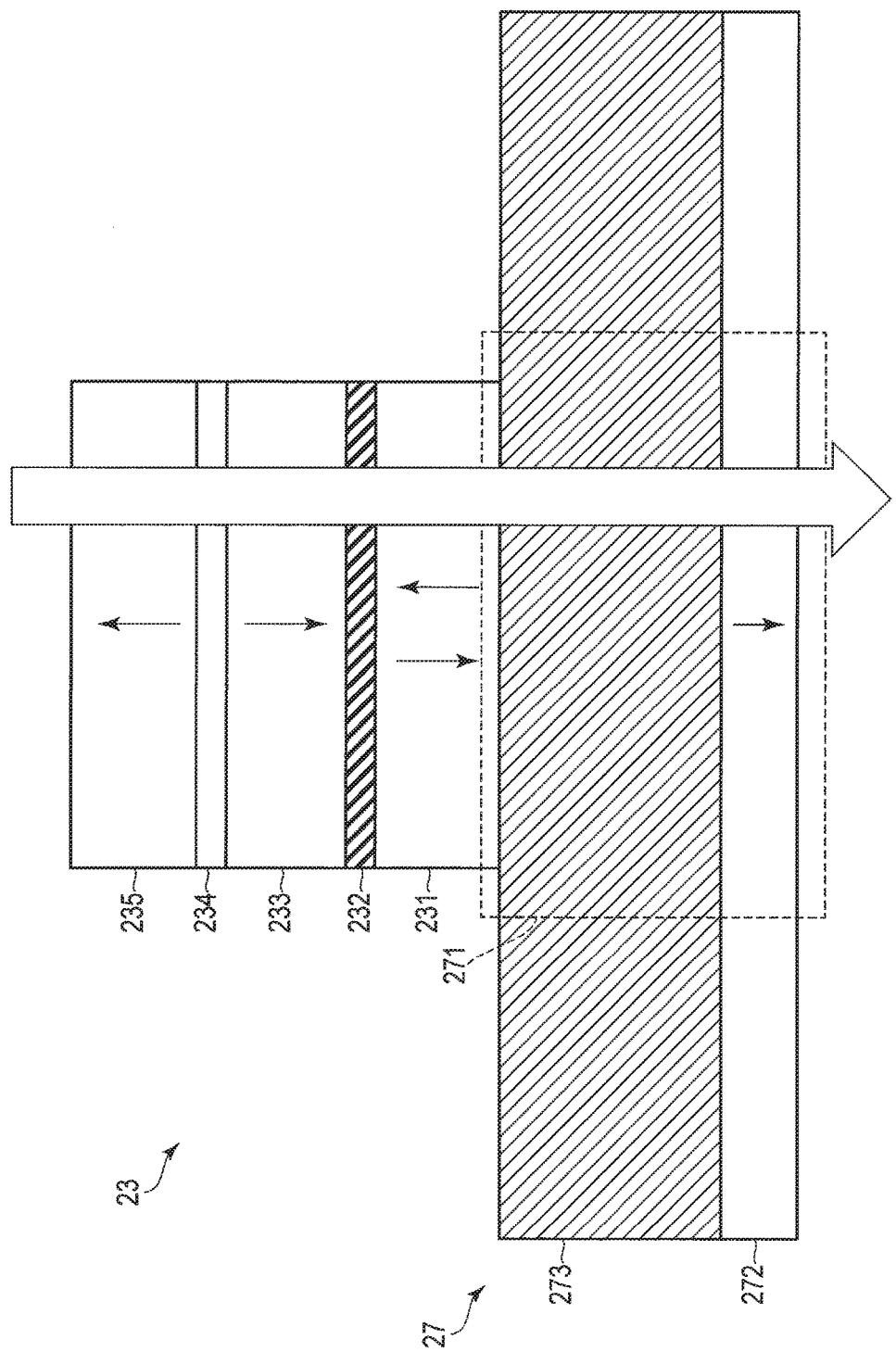
FIG. 10 is a schematic view illustrating an operation at read time of the magnetic storage device according to the first embodiment.

Next, an example of the read operation of the magnetic storage device 1 according to the first embodiment is described with reference to FIG. 9 and FIG. 10. FIG. 9 is a waveform chart for describing an operation at read time of the magnetic storage device 1 according to the first embodiment. FIG. 10 is a schematic view for describing a current path at read time of the magnetic storage device 1 according to the first embodiment.

Upon receiving a read command which instructs data read, the input/output circuit 16 transfers a read signal which instructs data read and an address of a read source to the controller 17. Of the address of the read source, the controller 17 transfers a row address to the row decoder 14, and a column address to the SA/WD 13.

The row decoder 14 and SA/WD 13 select the memory cell 20 of the read target, based on the row address and column address. Specifically, the row decoder 14 selects a first word line 24 corresponding to the memory cell 20 of the read target, and raises the potential of the first word line 24 from a low potential L to a high potential H, thereby turning on the first transistor 21. In addition, the row decoder 14 selects a second word line 25 corresponding to the memory cell 20 of the write target, and raises the potential of the second word line 25 from a low potential L to a high potential H, thereby turning on the second transistor 22. The SA/WD 13 sets the selected first bit line 26 at a potential VR, and sets the source line 28 at a ground potential Vss, thereby causing a read current to flow. The non-selected first bit line is set at a ground potential Vss. In the meantime, at a time of read, the second bit line 27 is not selected, and is cut off from the current path. Specifically, the SA/WD 13 turns off a transistor provided within the SA/WD 13, thereby cutting off the second bit line 27 from the current path. Alternatively, the SA/WD 13 may set the second bit line 27 at a potential which is higher than the ground potential Vss and is lower than the potential VR. Thereby, in the selected memory cell 20, an electric current flows from the first bit line 26 toward the source line 28 via the magnetoresistive effect element 23. The potential VR has such a value as to cause a read current to flow to the memory cell 20 in this manner.

Subsequently, the SA/WD 13 compares the value of the read current with a current value of a reference current, and determines whether the data of the memory cell 20 of the read target is "0" or "1". As a result of the determination, the data stored in the memory cell 20 is transferred to the page buffer 15. The input/output circuit 16 transmits the read data, which is stored in the page buffer 15, to the controller.

By the above, the read operation is completed.

1.4. Advantageous Effects of Present Embodiment

In the spin transfer torque writing method in which a magnetization reversal current is passed through the magnetoresistive effect element 23, thereby to transfer spins to the storage layer 231 and to reverse the magnetization orientation of the storage layer 231, an electric current with a large value flows at a time of writing data "1". Specifically, in the spin transfer torque writing method, when data "1" is written, an electric current of, e.g. about 1 MA/cm$^2$ flows to the tunnel barrier layer 232. Thus, it is possible that dielectric breakdown is caused in the tunnel barrier layer 232 by the data "1" write current. Specifically, it is possible that the dielectric breakdown of the tunnel barrier layer 232 rate-determines the life of the magnetoresistive effect element as a product. By contrast, the present embodiment aims at decreasing the value of the electric current flowing into the tunnel barrier layer 232.

According to the first embodiment, there is provided the second transistor 22 which has one terminal connected to the reference layer 233 side of the magnetoresistive effect element 23, and has the other terminal connected to the first bit line 26. Thereby, the memory cell 20 can control the current flowing into the magnetoresistive effect element 23 by using, in addition to two terminals for use at read time, a third terminal for use at write time. If a supplementary description is given, the first bit line 26 and source line 28 function mainly as two terminals for passing an electric current through the magnetoresistive effect element 23 at data read time. In addition, at data write time, the second bit line 27 functions as a third terminal for writing data without causing an electric current to flow through the magnetoresistive effect element 23. The first transistor 21 and second transistor 22 can control the current paths at the data write time and data read time. By turning off the second transistor 22 at the write time, the path of the write current is limited to the path between the second bit line 27 and source line 28. Accordingly, the value of the current flowing into the tunnel barrier layer 232 can be reduced. On the other hand, at the read time, by turning on the second transistor 22, a current path including the magnetoresistive effect element 23 is formed, and a read current can be passed through the magnetoresistive effect element 23.

Additionally, according to a first mode of the first embodiment, when data "1" is written or when data "0" is written, the second transistor 22 is turned off. Thereby, at the data "1" write time when the write current value is relatively large, it is possible to prevent the write current from flowing into the tunnel barrier layer 232. Accordingly, it is possible to prevent dielectric breakdown from occurring in the tunnel barrier layer 232 by the write current.

Additionally, according to a second mode of the first embodiment, in addition to the first mode of the first embodiment, the magnetization orientation of the polarizing layer 272 and the magnetization orientation of the reference layer 233 are set to be parallel to each other. Thereby, the polarizing layer 272 and reference layer 233 can be magnetized at the same time. Therefore, the manufacturing process can be made shorter.

Additionally, according to a third mode of the first embodiment, in addition to the second mode of the first embodiment, at the time of the write operation of data "1", an electric current is caused to flow from the polarizing layer 272 to shunt layer 273 of the multilayer portion 271. Thereby, at the write time of data "1", electrons, which are spin-polarized in a direction antiparallel to the magnetization orientation of the polarizing layer 272, are accumulated in the shunt layer 273. The accumulated spin-polarized electrons are absorbed in the storage layer 231 as a spin current, and the magnetization orientation of the storage layer 231 can be reversed to the direction antiparallel to the magnetization orientation of the reference layer 233. Therefore, the value of the current flowing into the tunnel barrier layer 232 can be decreased.

Additionally, according to a fourth mode of the first embodiment, in addition to the second mode of the first embodiment, at the time of the write operation of data "0", an electric current is caused to flow from the shunt layer 273 to polarizing layer 272 of the multilayer portion 271. Thereby, at the write time of data "0", electrons, which are spin-polarized in a direction parallel to the magnetization orientation of the polarizing layer 272, are accumulated in the shunt layer 273. The accumulated spin-polarized electrons are absorbed in the storage layer 231 as a spin current, and the magnetization orientation of the storage layer 231 can be reversed to the direction parallel to the magnetization orientation of the reference layer 233. Therefore, the value of the current flowing into the tunnel barrier layer 232 can be further decreased.

Additionally, according to a fifth mode of the first embodiment, in addition to the first embodiment, memory cells 20, to which data write can be executed without passing an electric current through the magnetoresistive effect elements 23, are commonly connected to an identical second bit line 27. Therefore, the integration density of the magnetic storage device 1 can be increased.

Additionally, according to a sixth mode of the first embodiment, in addition to the fourth mode of the first embodiment, each of memory cells 20 of a first memory cell group, which are commonly connected to a second bit line 27, and each of memory cells 20 of a second memory cell group, which are commonly connected to another second bit line 27, are commonly connected to an identical first word line 24 and an identical second word line 25. Therefore, the integration density of the magnetic storage device 1 can be further increased.

Additionally, according to a seventh mode of the first embodiment, in addition to the first embodiment, the second transistor 22 includes a conductive oxide film for the channel region thereof. Thereby, without being affected by activation of the second transistor 22, the magnetoresistive effect element 23 can maintain the performance as a memory element. If a supplementary description is given, the second transistor 22 is disposed above the magnetoresistive effect element 23, relative to the semiconductor substrate 31. Thus, the magnetoresistive effect element 23 suffers the influence of the activation step of the second transistor 22. By using the conductive oxide film for the channel region, the second transistor 22 is formed without using polysilicon. A transistor, which is formed by using polysilicon for a channel region, requires heat treatment at high temperatures of, e.g. 800° C. to 1000° C., in order to activate the channel region. If the magnetoresistive effect element 23 is subjected to such high-temperature heat treatment, it is possible that the function thereof as a memory element is lost. Thus, it is difficult to form the transistor, which is formed by using polysilicon for the channel region, above the magnetoresistive effect element 23. On the other hand, the second transistor 22 is formed by using the conductive oxide film for the channel region. The conductive oxide film does not require the high-temperature heat treatment in order to activate the channel region. Thus, the second transistor 22 is provided above the semiconductor substrate 31, while the performance of the magnetoresistive effect element 23 is maintained. Therefore, the value of the current flowing into the tunnel barrier layer 232 can be decreased.

Additionally, according to an eighth mode of the first embodiment, in addition to the first embodiment, the second transistor 22 includes the surrounding gate structure. Thereby, the second transistor 22 can be disposed above the magnetoresistive effect element 23. Therefore, the integration density of the magnetic storage device 1 can be increased.

Additionally, according to a ninth mode of the first embodiment, in addition to the first embodiment, the first transistor 21 is provided on the surface of the semiconductor substrate 31. Thereby, the memory cell array 11 can be provided, while the surface of the semiconductor substrate 31 is utilized for the first transistor 21. Therefore, the integration density of the magnetic storage device 1 can be increased.

Additionally, according to a tenth mode of the first embodiment, in addition to the first embodiment, the polarizing layer 272 and shunt layer 273 are provided over the second bit line 27. Thereby, the multilayer portions 271 in the memory cells 20, which are commonly connected to the second bit line 27, can be manufactured by a single fabrication step. Therefore, the magnetic storage device 1 can be manufactured by a less number of fabrication steps.

2. Second Embodiment

Next, a magnetic storage device according to a second embodiment is described. The second embodiment differs from the first embodiment in that the magnetization orientation of the polarizing layer 272 and the magnetization orientation of the reference layer 233 are set to be antiparallel to each other. In the description below, only different points from the first embodiment will be described.

2.1. Re: Configuration of Magnetoresistive Effect Element and Second Bit Line

Referring to FIG. 11, a description is given of the configuration of a magnetoresistive effect element and a second bit line of the magnetic storage device according to the second embodiment. FIG. 11 is a cross-sectional view illustrating a yz cross section of the magnetoresistive effect element 23 and second bit line 27 of the magnetic storage device 1 according to the second embodiment. As illustrated in the Figure, the magnetization orientation of the polarizing layer 272 is set to be antiparallel to the magnetization orientation of the reference layer 233.

As described above, if a write current in a direction from the polarizing layer 272 toward the shunt layer 273, is caused to flow through the multilayer portion 271, electrons having spins polarized in a direction antiparallel to the magnetization orientation of the polarizing layer 272 are accumulated in the vicinity of the current path in the shunt layer 273. The storage layer 231 absorbs the accumulated polarized spins, and reverses the magnetization orientation to the direction of the absorbed spins. Here, since the magnetization orientation of the reference layer 233 is antiparallel to the magnetization orientation of the polarizing layer 272, the reversed magnetization orientation of the storage layer 231 becomes parallel to the magnetization orientation of the reference layer 233.

In addition, if a write current in a direction from the shunt layer 273 toward the polarizing layer 272, is caused to flow through the multilayer portion 271, electrons having spins polarized in a direction parallel to the magnetization orientation of the polarizing layer 272 are accumulated in the vicinity of the current path in the shunt layer 273. The storage layer 231 absorbs the accumulated polarized spins, and reverses the magnetization orientation to the direction of the absorbed spins. Here, since the magnetization orientation of the reference layer 233 is antiparallel to the magnetization orientation of the polarizing layer 272, the reversed magnetization orientation of the storage layer 231 becomes antiparallel to the magnetization orientation of the reference layer 233.

2.2. Re: Write Operation

Figure 12:
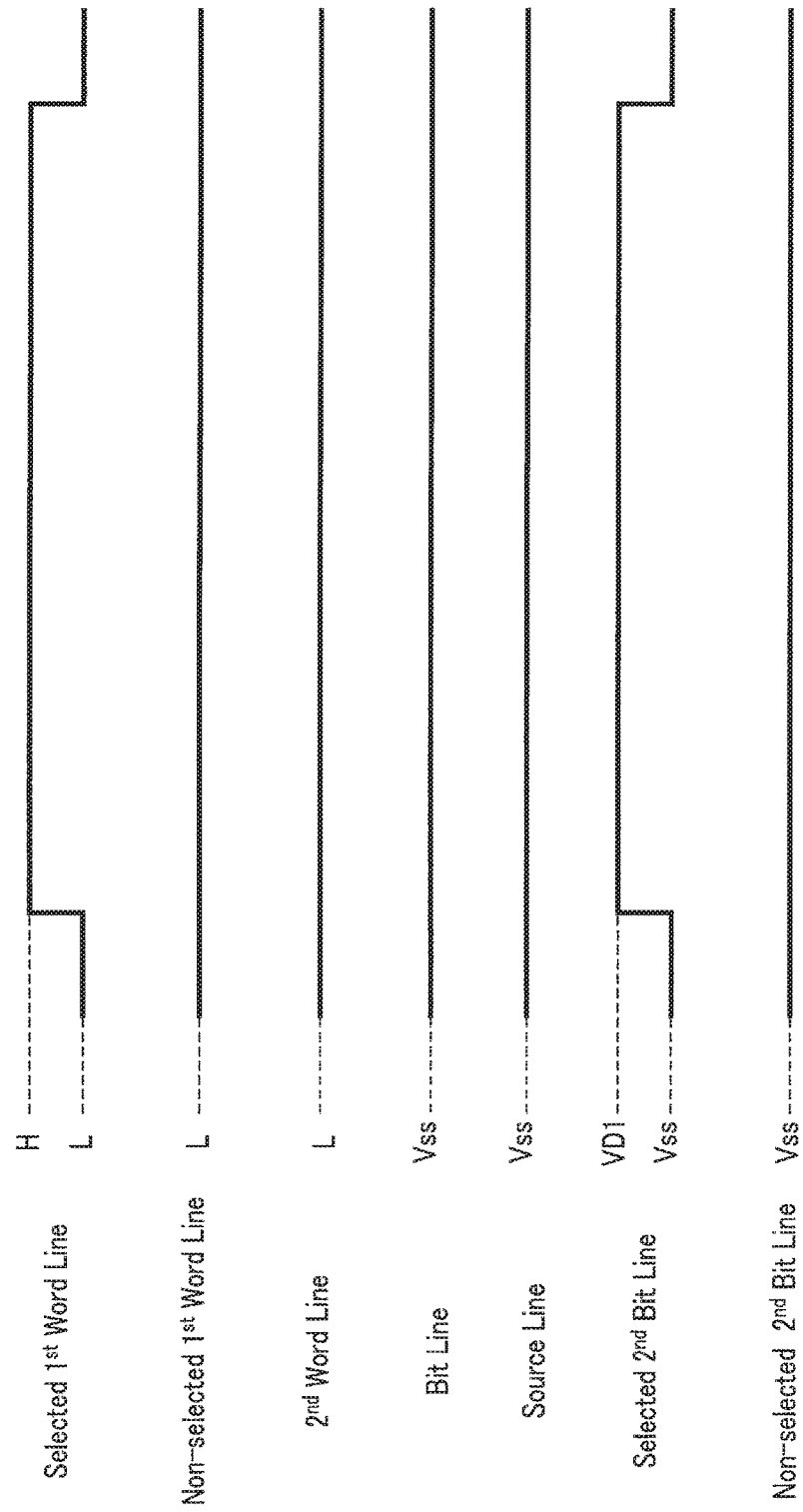
FIG. 12 is a waveform chart illustrating an operation at write time of the magnetic storage device according to the second embodiment.
Figure 13:
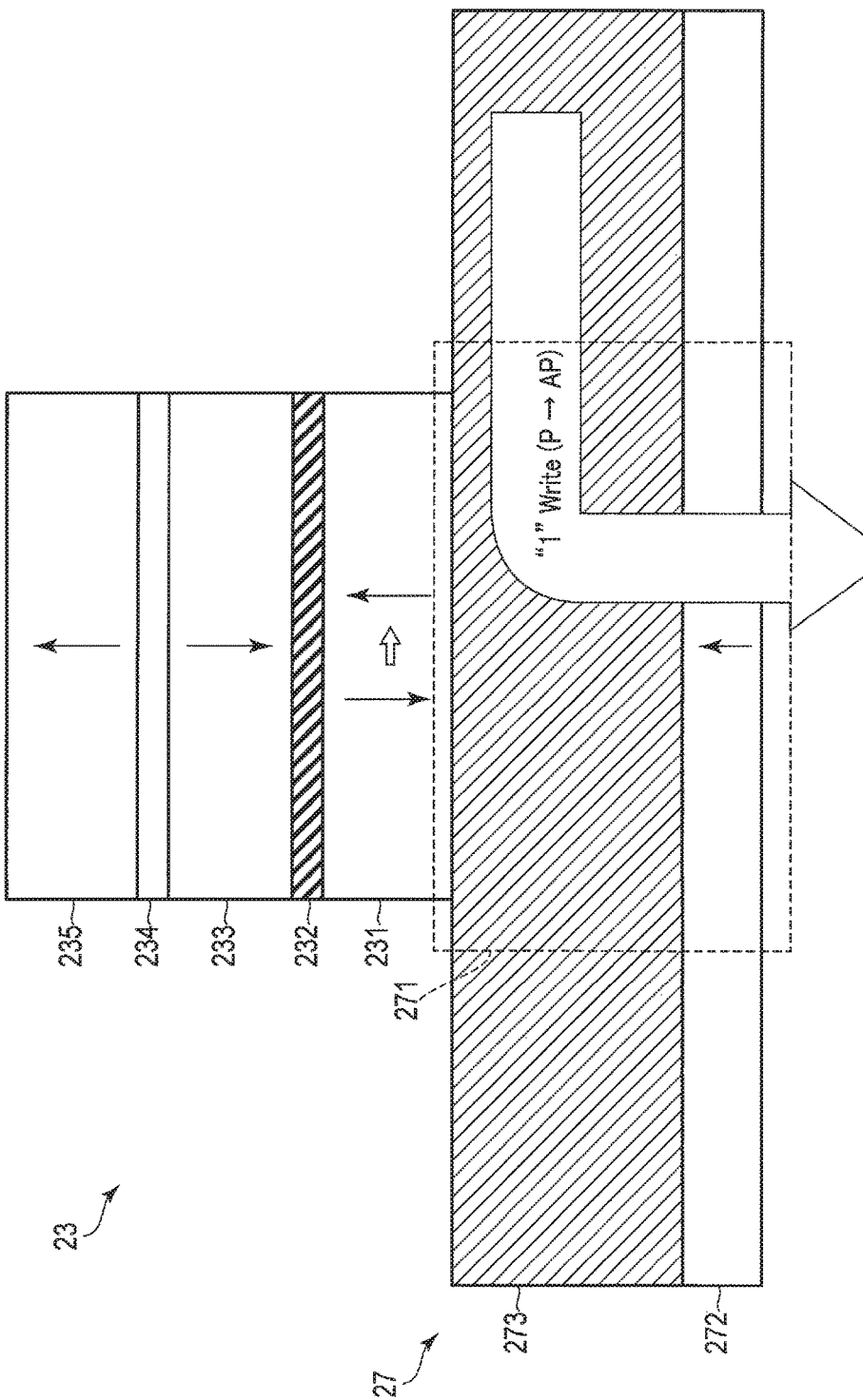
FIG. 13 is a schematic view illustrating an operation at write time of the magnetic storage device according to the second embodiment.
Figure 14:
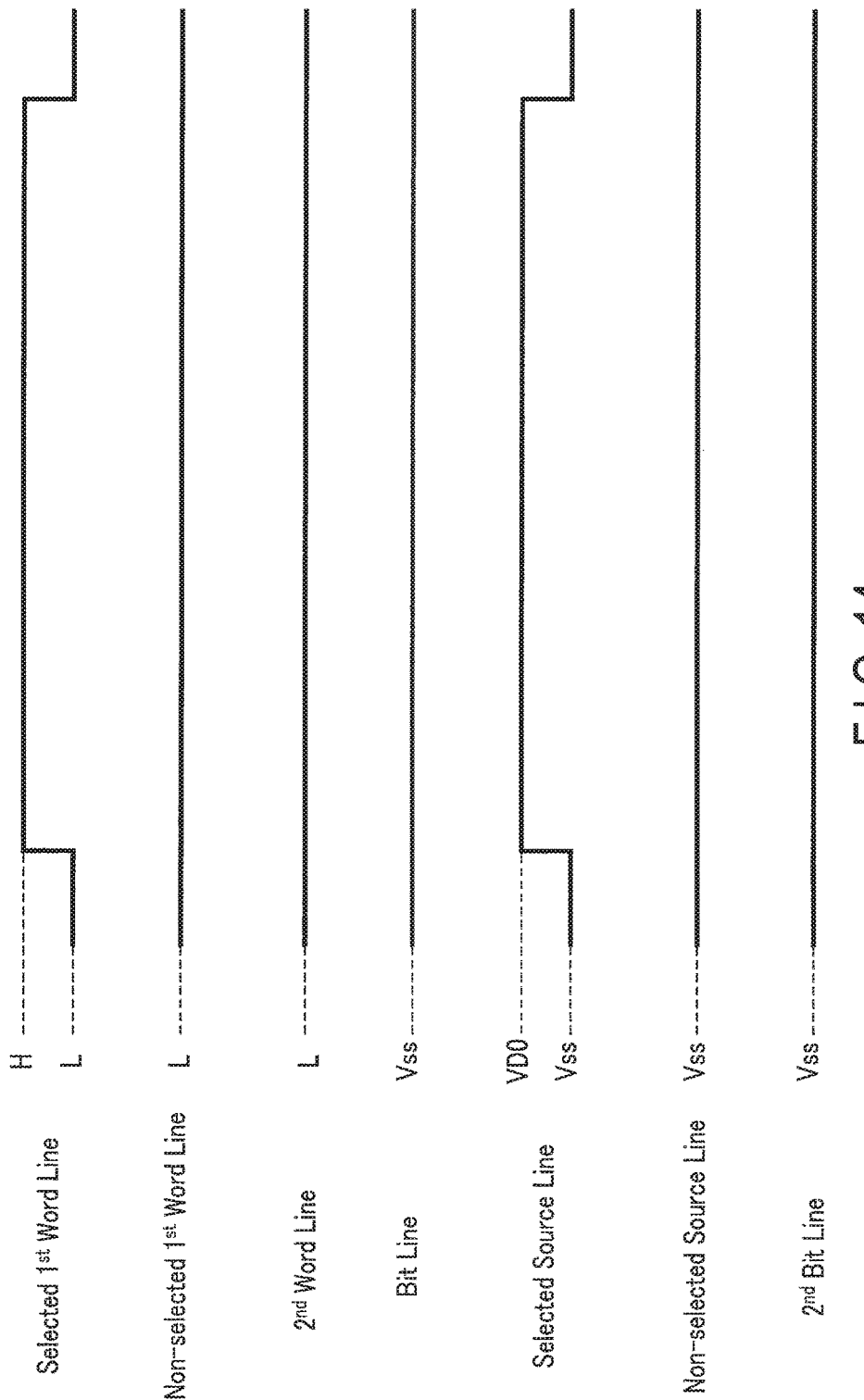
FIG. 14 is a waveform chart illustrating an operation at write time of the magnetic storage device according to the second embodiment.
Figure 15:
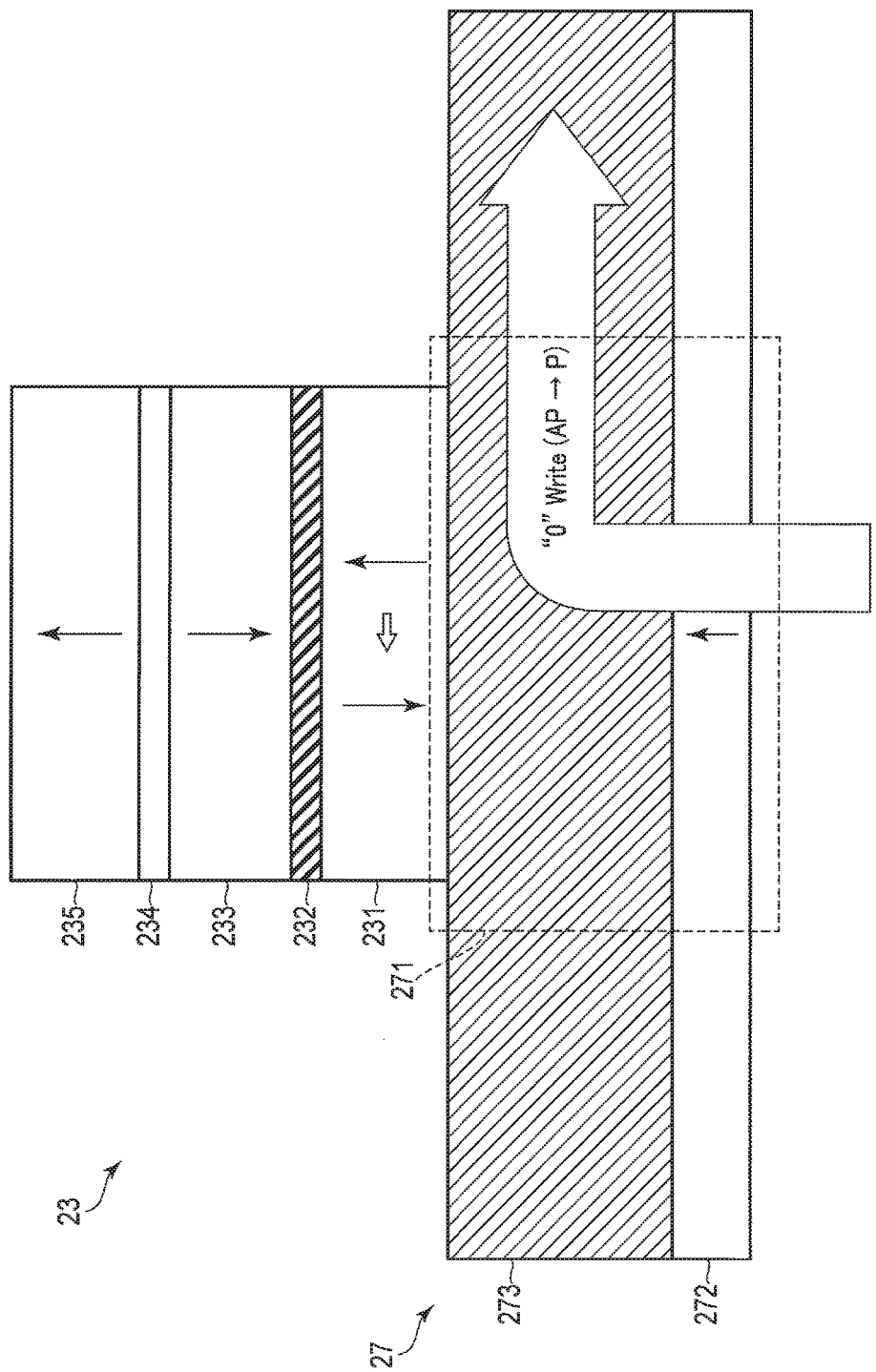
FIG. 15 is a schematic view illustrating an operation at write time of the magnetic storage device according to the second embodiment.

Next, the write operation of the magnetic storage device according to the second embodiment is described with reference to FIG. 12 to FIG. 15. FIG. 12 and FIG. 14 are waveform charts for describing operations at write time of the magnetic storage device 1 according to the second embodiment. FIG. 13 and FIG. 15 are schematic views for describing current paths at write time of the magnetic storage device 1 according to the second embodiment.

To begin with, referring to FIG. 12 and FIG. 13, a case of writing data "1" to the memory cell 20 is described.

Since the operations of the input/output circuit 16, controller 17 and row decoder 14 are the same as in the data "1" write in the first embodiment, a description thereof is omitted.

The SA/WD 13 selects the memory cell 20 of the column of the write target in accordance with the decoded result of the column address, and writes the data, which is stored in the page buffer 15, to the selected memory cell 20, based on the write signal. Specifically, the SA/WD 13 sets the second bit line 27, which is connected to the memory cell 20 of the write target, at a potential VD1, and sets the source line 28 at a ground potential Vss. In addition, the non-selected second bit line 27 is set at a ground potential Vss. In the meantime, when data "1" is written, the first bit line 26 is not selected, and is set to remain at a ground potential Vss.

Thereby, in the selected memory cell 20, an electric current flows from the second bit line 27 toward the source line 28 via the multilayer portion 271. In other words, in the selected memory cell 20, electrons flow from the polarizing layer 272 toward the shunt layer 273, without intervention of the magnetoresistive effect element 23. Electrons, which are spin-polarized in a direction parallel to the magnetization orientation of the polarizing layer 272, are accumulated in the shunt layer 273 and absorbed in the storage layer 231. The magnetization orientation of the storage layer 231 is reversed to the direction which is parallel to the magnetization orientation of the polarizing layer 272. Since the magnetization orientation of the polarizing layer 272 is antiparallel to the magnetization orientation of the reference layer 233, data "1" is written to the magnetoresistive effect element 23 in the selected memory cell 20.

Next, referring to FIG. 14 and FIG. 15, a case of writing data "0" to the memory cell 20 is described. When data "0" is written, an electric current in a direction opposite to the case of writing data "1" flows through the memory cell 20.

Since the operations of the input/output circuit 16, controller 17 and row decoder 14 are the same as in the data "0" write in the first embodiment, a description thereof is omitted.

The SA/WD 13 selects the memory cell 20 of the column of the write target in accordance with the decoded result of the column address, and writes the data, which is stored in the page buffer 15, to the selected memory cell 20, based on the write signal. Specifically, the SA/WD 13 sets the source line 28, which is connected to the memory cell 20 of the write target, at a potential VD0, and sets the second bit line 27 at a ground potential Vss. The non-selected source line 28 is set at a ground potential Vss. In the meantime, when data "0" is written, the first bit line 26 is not selected, and is set to remain at a ground potential Vss.

Thereby, in the selected memory cell 20, an electric current flows from the source line 28 toward the second bit line 27 via the multilayer portion 271. In other words, in the selected memory cell 20, electrons flow from the shunt layer 273 toward polarizing layer 272 in the multilayer portion 271, without intervention of the magnetoresistive effect element 23. Electrons, which are spin-polarized in a direction antiparallel to the magnetization orientation of the polarizing layer 272, are accumulated in the shunt layer 273 and absorbed in the storage layer 231. The magnetization orientation of the storage layer 231 is reversed to the direction which is antiparallel to the magnetization orientation of the polarizing layer 272. Since the magnetization orientation of the polarizing layer 272 is antiparallel to the magnetization orientation of the reference layer 233, data "0" is written to the magnetoresistive effect element 23 in the selected memory cell 20.

2.3. Advantageous Effects of Present Embodiment

According to the second embodiment, the magnetization orientation of the polarizing layer 272 and the magnetization orientation of the reference layer 233 are set to be antiparallel to each other. Accordingly, even in the case where the magnetization orientation of the polarizing layer 272 and the magnetization orientation of the reference layer 233 are different, there can be provided the magnetic storage device 1 which can decrease the value of the current flowing into the tunnel barrier layer 232.

Additionally, according to a first mode of the second embodiment, in addition to the second embodiment, at the time of the write operation of data "1", an electric current is caused to flow from the shunt layer 273 to polarizing layer 272 of the multilayer portion 271. Thereby, at the write time of data "1", electrons, which are spin-polarized in a direction parallel to the magnetization orientation of the polarizing layer 272, are accumulated in the shunt layer 273. The accumulated spin-polarized electrons are absorbed in the storage layer 231 as a spin current, and the magnetization orientation of the storage layer 231 can be reversed to the direction antiparallel to the magnetization orientation of the reference layer 233. Therefore, the value of the current flowing into the tunnel barrier layer 232 can be decreased at the time of the data "1" write, which may cause dielectric breakdown of the tunnel barrier layer 232.

Additionally, according to a second mode of the second embodiment, in addition to the second embodiment, at the time of the write operation of data "0", an electric current is caused to flow from the polarizing layer 272 to the shunt layer 273 of the multilayer portion 271. Thereby, at the write time of data "0", electrons, which are spin-polarized in a direction antiparallel to the magnetization orientation of the polarizing layer 272, are accumulated in the shunt layer 273. The accumulated spin-polarized electrons are absorbed in the storage layer 231 as a spin current, and the magnetization orientation of the storage layer 231 can be reversed to the direction parallel to the magnetization orientation of the reference layer 233. Therefore, the value of the current flowing into the tunnel barrier layer 232 can be further decreased.

Furthermore, according to the second embodiment, the same advantageous effects as in the fifth to ninth modes of the first embodiment can be obtained.

3. Third Embodiment

Next, a magnetic storage device according to a third embodiment is described. The third embodiment differs from the above-described first embodiment and second embodiment in that a spin transfer torque writing method is used at a time of data "0" write. In the description below, only different points from the first embodiment will be described.

3.1. Re: Write Operation

Figure 16:
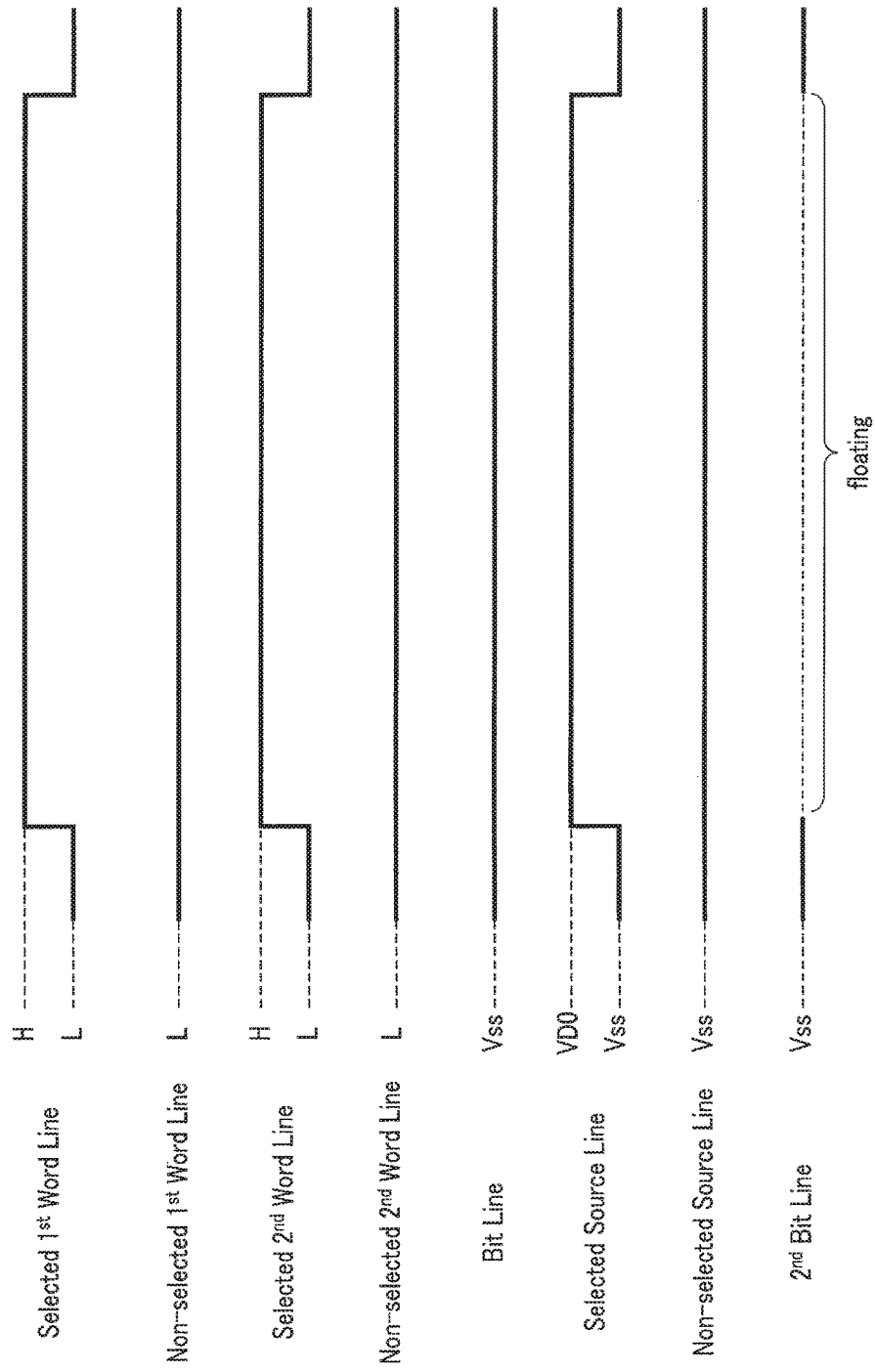
FIG. 16 is a waveform chart illustrating an operation at write time of a magnetic storage device according to a third embodiment.
Figure 17:
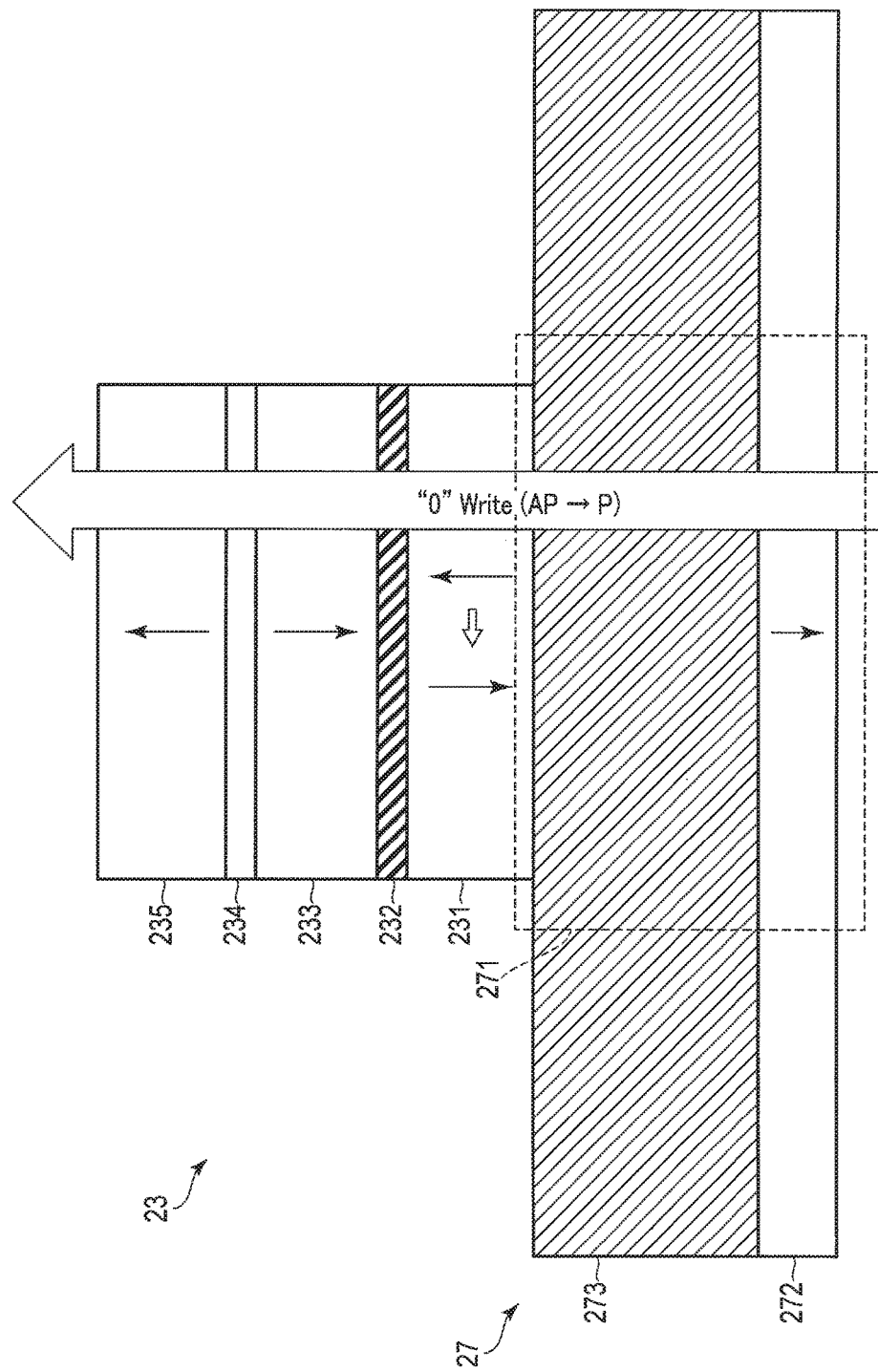
FIG. 17 is a schematic view illustrating an operation at write time of the magnetic storage device according to the third embodiment.

The write operation of data "0" of the magnetic storage device according to the third embodiment is described with reference to FIG. 16 and FIG. 17. FIG. 16 is a waveform chart for describing an operation at write time of the magnetic storage device 1 according to the third embodiment. FIG. 17 is a schematic view for describing a current path at write time of the magnetic storage device 1 according to the third embodiment.

Since the operations of the input/output circuit 16, controller 17 and row decoder 14 are the same as in the data "0" write in the first embodiment, a description thereof is omitted.

The SA/WD 13 selects the memory cell 20 of the column of the write target in accordance with the decoded result of the column address, and writes the data, which is stored in the page buffer 15, to the selected memory cell 20, based on the write signal. Specifically, the SA/WD 13 sets the source line 28, which is connected to the memory cell 20 of the write target, at a potential VD0, and sets the first bit line 26 at a ground potential Vss. In addition, the non-selected source line 28 is set at a ground potential Vss. In the meantime, when data "0" is written, the second bit line 27 is not selected, and is set in a floating state. Specifically, the SA/WD 13 cuts off the second bit line 27 from the current path by turning off a transistor in the SA/WD 13.

Thereby, in the selected memory cell 20, a magnetization reversal current flows from the source line 28 toward the first bit line 26 via the magnetoresistive effect element 23. Accordingly, data "0" is written to the magnetoresistive effect element 23 in the selected memory cell 20.

3.2. Advantageous Effects of Present Embodiment

According to the third embodiment, at the time of the data "0" write operation, the second transistor 22 is turned on so that a current may flow in the film thickness direction. Thereby, at the data "0" write time, write can be executed by using the spin transfer torque writing method. If a supplementary description is given, the value of the current flowing through the magnetoresistive effect element 23 at the data "0" write time is less than the value of the current at the data "1" write time. Thus, at the data "0" write time, the possibility is low that dielectric breakdown occurs in the tunnel barrier layer 232. Therefore, at the data "0" write time, a more general writing method can be used.

Furthermore, according to the third embodiment, the same advantageous effects as in the respective modes, excluding the third mode of the first embodiment and the second mode of the second embodiment, can be obtained.

4. Fourth Embodiment

Next, a magnetic storage device according to a fourth embodiment is described. The fourth embodiment differs from the first embodiment in that the first transistor 21 is altered from the planar type structure to a surrounding gate structure. In the description below, only different points from the first embodiment will be described.

4.1. Re: Configuration of Memory Cell Array

Figure 18:
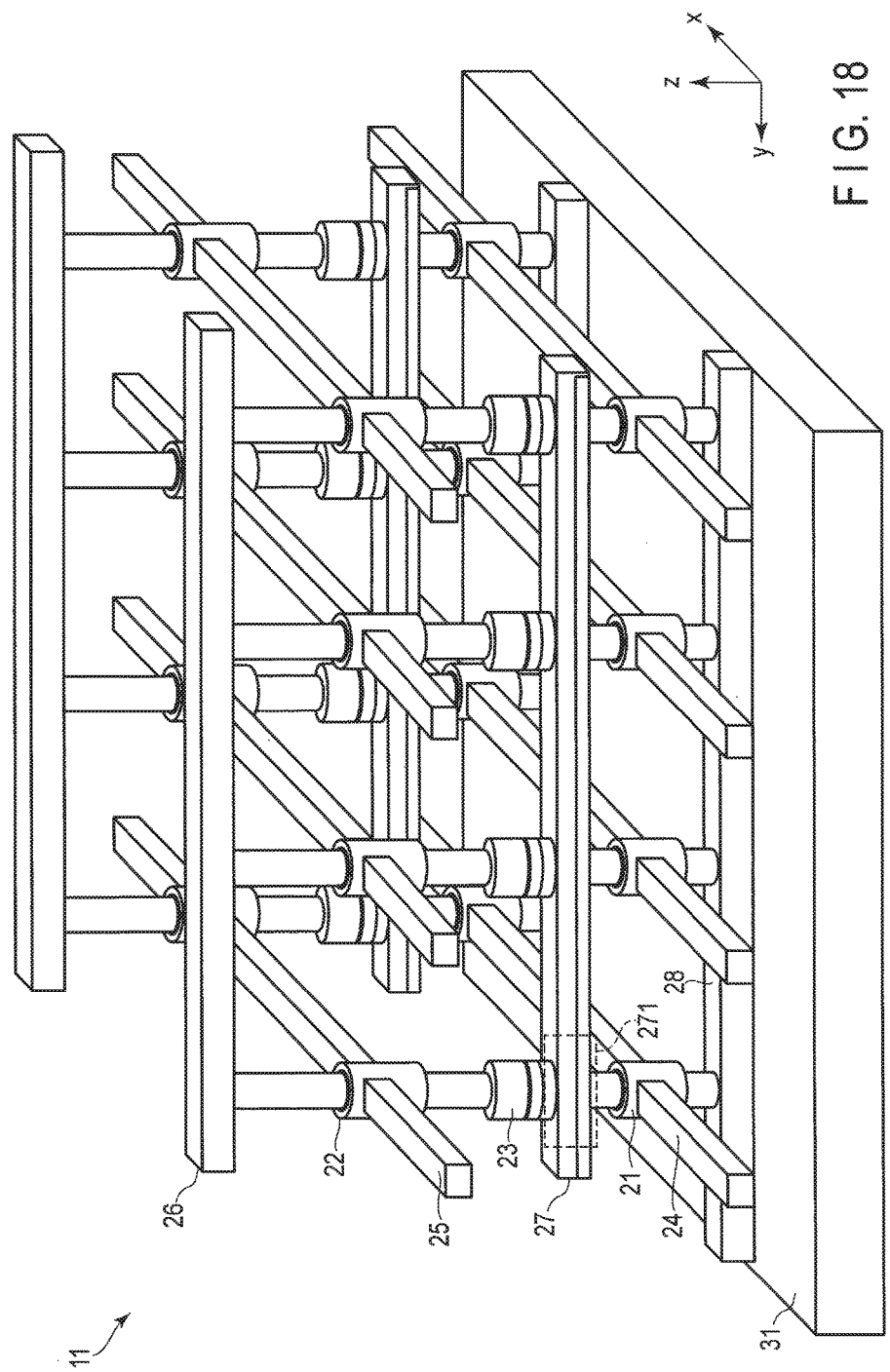
FIG. 18 is a perspective view illustrating a configuration example of a memory cell array of a magnetic storage device according to a fourth embodiment.

Referring to FIG. 18, a description is given of the configuration of a memory cell array 11 of a magnetic storage device 1 according to the fourth embodiment. FIG. 18 is a perspective view illustrating the configuration of the memory cell array 11 of the magnetic storage device 1 according to the fourth embodiment.

As illustrated in the Figure, the memory cell array 11 is disposed on the semiconductor substrate 31 via an insulation film (not shown). A plurality of source lines 28 are disposed along the y direction on the upper surface of the insulation film (not shown). The plural source lines 28 are arranged in the x direction. A plurality of first transistors 21 are disposed along the y direction on the upper surface of each source line 28. The first transistor includes a surrounding gate structure. One terminal of the channel region of each of the first transistors 21 disposed along the y direction is commonly connected to an identical source line 28, and the other terminal thereof is commonly connected to an identical second bit line 27. In the meantime, the first transistor 21 is connected to the polarizing layer 272 in the multilayer portion 271 of the second bit line 27.

4.2. Advantageous Effects of Present Embodiment

According to the fourth embodiment, the first transistor 21 is configured to include the surrounding gate structure. Therefore, the magnetic storage device 1 with a higher integration density can be provided.

Furthermore, according to the fourth embodiment, the same advantageous effects as in the first to third embodiments can be obtained.

5. Fifth Embodiment

Next, a magnetic storage device according to a fifth embodiment is described. In the fifth embodiment, in addition to the first embodiment, the memory cell array 11 is vertically inverted such that the above-described second transistor 22 is provided on the surface of the semiconductor substrate 31. In the description below, only different points from the first embodiment will be described.

5.1. Re: Configuration of Memory Cell Array

Figure 19:
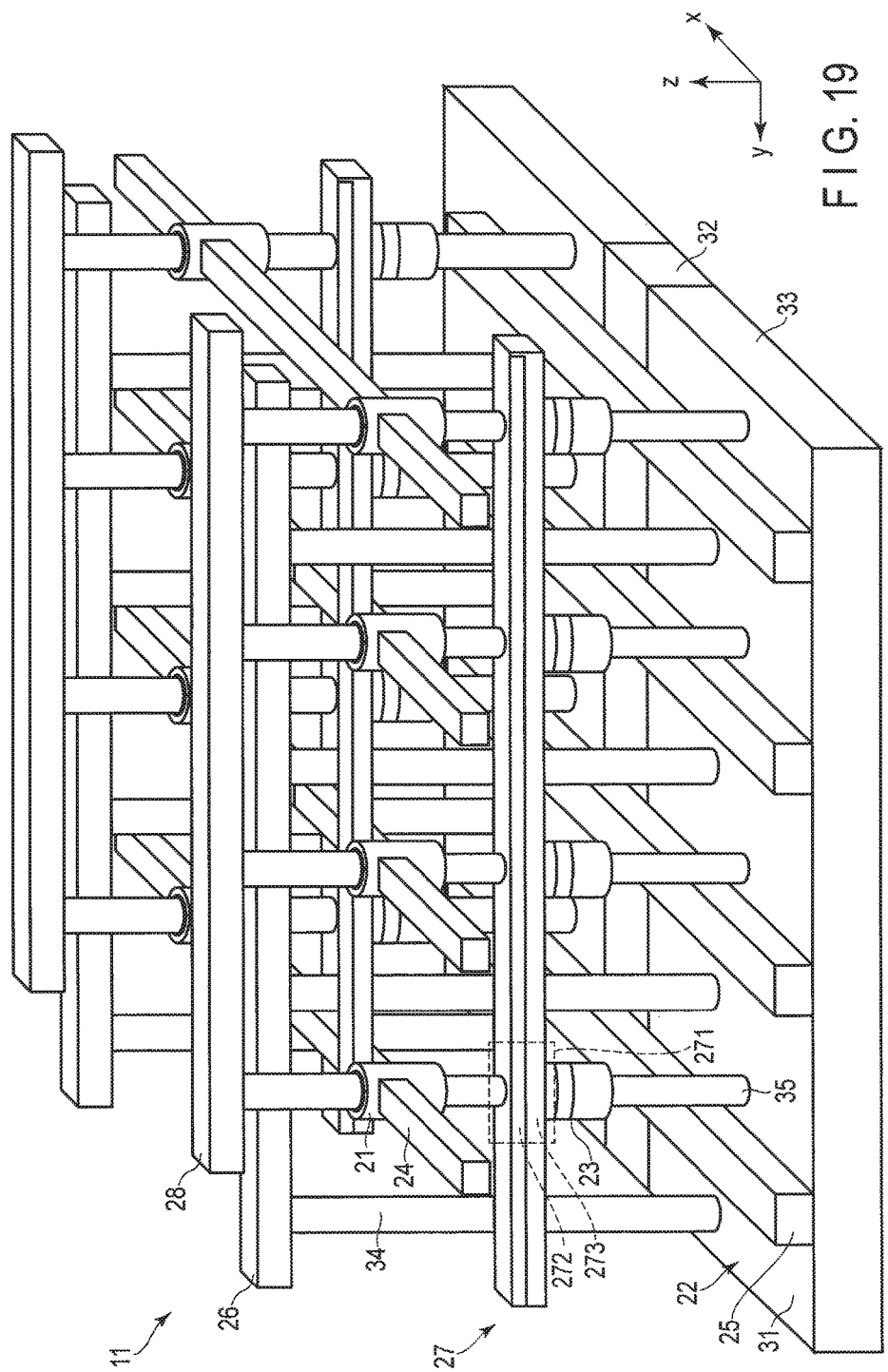
FIG. 19 is a perspective view illustrating a configuration example of a memory cell array of a magnetic storage device according to a fifth embodiment.

The configuration of the memory cell array 11 of the magnetic storage device 1 according to the fifth embodiment is described with reference to FIG. 19. FIG. 19 is a perspective view which schematically illustrates the configuration of the memory cell array 11 of the magnetic storage device 1 according to the fifth embodiment.

As illustrated in the Figure, a plurality of second word lines 25 are disposed along the x direction on the semiconductor substrate 31. The plural second word lines 25 are arranged in the y direction. In each device formation region 33, a plurality of second transistors 22 are formed along the y direction. Each second transistor 22 includes a pair of source/drain regions (not shown) formed on a surface of the semiconductor substrate 31 at both ends of one second word line 25. The plural second transistors 22, which are arranged in the x direction via the STI 32, are commonly connected to the second word line 25. One terminal of each of the second transistors 22, which are arranged in the y direction in the identical device formation region 33, is commonly connected to the identical source line 28 via a source line contact 34. The other terminal of each of the second transistors 22 is connected to a lower surface of the shift cancelling layer 235 of the magnetoresistive effect element 23 via a bit line contact 35.

In the magnetoresistive effect element 23, the shift cancelling layer 235, spacer layer 234, reference layer 233, tunnel barrier layer 232 and storage layer 231 are stacked in the named order. In addition, in the second bit line 27, the shunt layer 273 and polarizing layer 272 are stacked in the named order. The shunt layer 273 in the multilayer portion 271 of the second bit line 27 is disposed on the upper surface of the storage layer 231 of the magnetoresistive effect element 23. The upper surfaces of the respective magnetoresistive effect elements 23, which are provided along the y direction, are commonly connected to the identical second bit line 27. The upper surface of the polarizing layer 272 in the multilayer portion 271 is connected to one terminal of the first transistor 21. The first transistor 21 has a surrounding gate structure in which a gate electrode is disposed via a gate insulation film on an outer side surface of a channel region which is deposited in the z direction. It is desirable to use, for the channel region, a conductive oxide film which does not require a high-temperature process which may affect the performance of the magnetoresistive effect element 23 at a time of film formation. As an example of the conductive oxide film, IGZO or zinc oxide, for instance, is applicable. The first transistors 21, which are disposed along the x direction, are commonly connected to the identical first word line 24. The other terminal of each of the first transistors 21, which are disposed along the y direction, is commonly connected to the identical first bit line 26.

5.2. Advantageous Effects of Present Embodiment

According to the fifth embodiment, the second transistor 22 is provided on the semiconductor substrate. Accordingly, the magnetoresistive effect element 23 has a top free-type configuration in which the storage layer 231 is stacked above the reference layer 233. Therefore, it is possible to provide the magnetic storage device 1 which can reduce the value of the current flowing into the tunnel barrier layer 232, also in the top free-type magnetoresistive effect element 23.

In addition, the first transistor 21 includes the conductive oxide film for the channel region. Therefore, it is possible to provide the magnetic storage device 1 which can reduce the value of the current flowing into the tunnel barrier layer 232, also in the case where the first transistor 21 is disposed above the magnetoresistive effect element 23.

Furthermore, according to the fifth embodiment, the same advantageous effects as in the first to fourth embodiments can be obtained.

6. Other Embodiments

Figure 20:
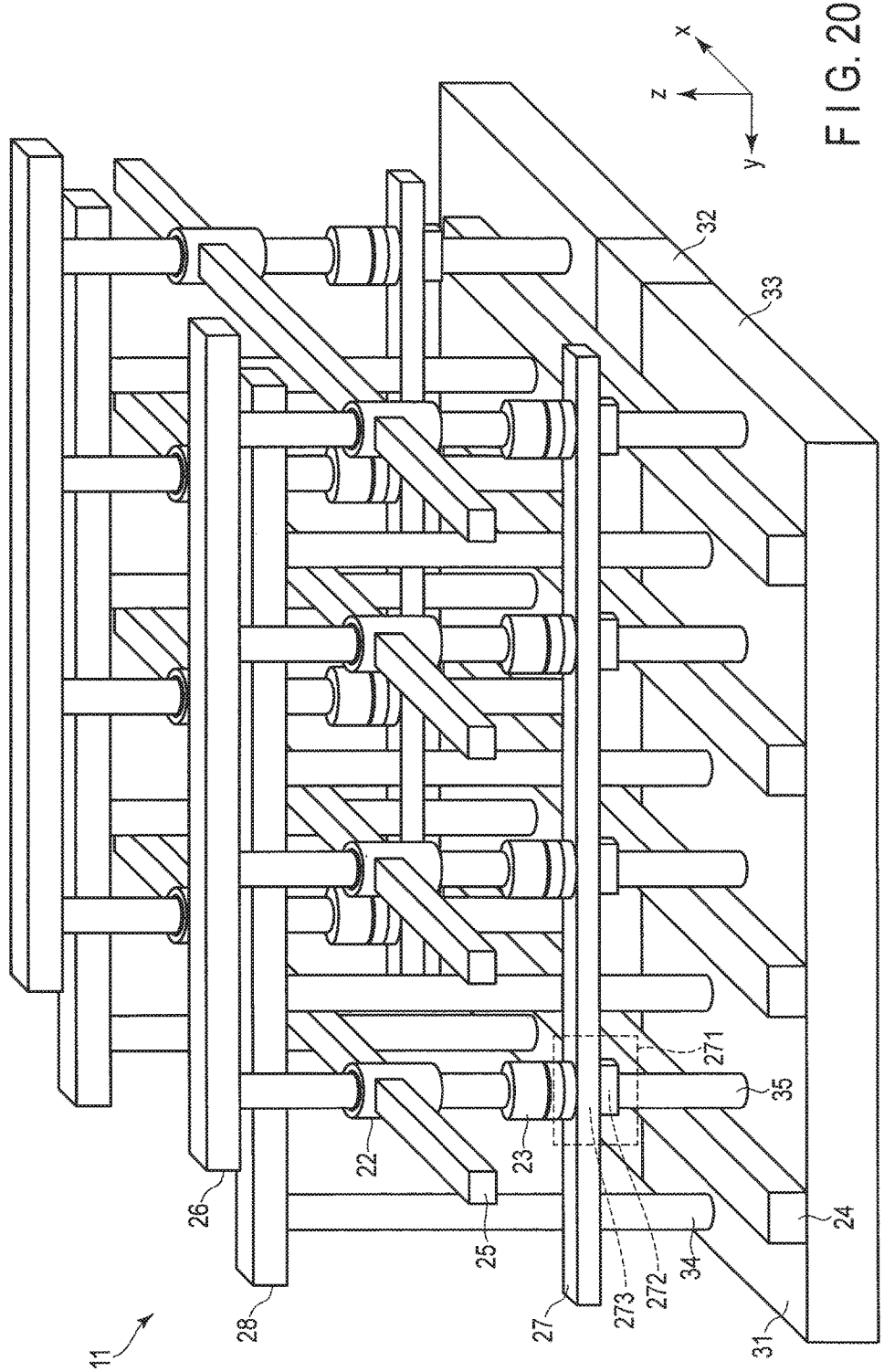
FIG. 20 is a perspective view illustrating a configuration example of a memory cell array of a magnetic storage device according to another embodiment.

In each of the above-described embodiments, the case was described in which the polarizing layer 272 and shunt layer 273 of the magnetic storage device 1 are provided over the second bit line 27. However, the embodiments are not limited to this case. FIG. 20 is a perspective view which schematically illustrates a configuration of a memory cell array 11 of a magnetic storage device 1 according to another embodiment. As illustrated in the Figure, the polarizing layer 272 may be provided, for example, only in the region of the multilayer portion 271 immediately below the magnetoresistive effect element 23.

According to this another embodiment, the electric current flowing between the first bit line 26 and second bit line 27 can efficiently execute spin accumulation in the local region immediately below the magnetoresistive effect element 23. Therefore, a write current can be caused to flow more efficiently.

Furthermore, according to this another embodiment, the same advantageous effects as in the second to fifth embodiments, as well as the first embodiment, can be obtained. When this another embodiment is applied to the fifth embodiment, the polarizing layer 272 is provided, for example, only in the region immediately above the magnetoresistive effect element 23.

Besides, in each of the above-described embodiments, the case was described in which the magnetoresistive effect element is the vertical magnetization MTJ. However, the embodiments are not limited to this case, and the magnetoresistive effect element may be a horizontal magnetization MTJ having a horizontal magnetic anisotropy.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetic storage device comprising:
a plurality of memory cells; and
one wire including a first ferromagnetic layer and a first nonmagnetic layer disposed on the first ferromagnetic layer,
wherein each of the plurality of memory cells includes:
a magnetoresistive effect element including a second ferromagnetic layer disposed on the first nonmagnetic layer, a third ferromagnetic layer, and a second nonmagnetic layer disposed between the second ferromagnetic layer and the third ferromagnetic layer;
a first transistor having a first terminal and a second terminal, the first terminal being electrically connected to the first ferromagnetic layer without interposing the second terminal, and the second terminal being electrically connected to a source line without interposing the first terminal; and
a second transistor having a first terminal electrically connected to the third ferromagnetic layer without interposing the wire, and a second terminal directly connected to a bit line which is different from the source line, and
wherein each of the second ferromagnetic layers is disposed on the first nonmagnetic layer such that the one wire, which is only one wire, interconnects all the magnetoresistive effect elements without interposing any other ferromagnetic layers between any two of the second ferromagnetic layers, and
wherein at a time of a write operation on a selected memory cell of the memory cells, the first transistor of the selected memory cell is turned on and the second transistor of the selected memory cell is turned off, and at a time of a read operation on the selected memory cell, the first and second transistors of the selected memory cell are turned on.

2. The device of claim 1, wherein a magnetization orientation of the first ferromagnetic layer and a magnetization orientation of the third ferromagnetic layer are parallel to each other.

3. The device of claim 2, wherein in the wire an electric current flows from the first ferromagnetic layer to the first nonmagnetic layer, at a time of a write operation of reversing a magnetization orientation of the second ferromagnetic layer to be antiparallel to the magnetization orientation of the third ferromagnetic layer.

4. The device of claim 2, wherein in the wire an electric current flows from the first nonmagnetic layer to the first ferromagnetic layer, at a time of a write operation of reversing a magnetization orientation of the second ferromagnetic layer to be parallel to the magnetization orientation of the third ferromagnetic layer.

5. The device of claim 1, wherein a magnetization orientation of the first ferromagnetic layer and a magnetization orientation of the third ferromagnetic layer are antiparallel to each other.

6. The device of claim 5, wherein in the wire an electric current flows from the first nonmagnetic layer to the first ferromagnetic layer, at a time of a write operation of reversing a magnetization orientation of the second ferromagnetic layer to be antiparallel to the magnetization orientation of the third ferromagnetic layer.

7. The device of claim 5, wherein in the wire an electric current flows from the first ferromagnetic layer to the first nonmagnetic layer, at a time of a write operation of reversing a magnetization orientation of the second ferromagnetic layer to be parallel to the magnetization orientation of the third ferromagnetic layer.

8. The device of claim 1, wherein the time of the write operation is a time of a write operation of reversing a magnetization orientation of the second ferromagnetic layer to be antiparallel to a magnetization orientation of the third ferromagnetic layer, and
the second transistor of the selected memory cell is turned on at a time of a write operation of reversing the magnetization orientation of the second ferromagnetic layer to be parallel to the magnetization orientation of the third ferromagnetic layer.

9. The device of claim 1, comprising:
a first set of the plurality of memory cells and the wire; and
a second set of the plurality of memory cells and the wire, wherein:
a gate electrode of the first transistor of a first memory cell of the first set of the memory cells is electrically connected to a gate electrode of the first transistor of a first memory cell of the second set of the memory cells, and
a gate electrode of the second transistor of the first memory cell of the first set of the memory cells is electrically connected to a gate electrode of the second transistor of the first memory cell of the second set of the memory cells.

10. The device of claim 1, wherein the first transistor includes a conductive oxide film for a channel region.

11. The device of claim 1, wherein the first transistor includes a surrounding gate structure.

12. The device of claim 1, wherein the first transistor is disposed on a surface of a semiconductor substrate.

13. The device of claim 1, wherein the second transistor includes a conductive oxide film for a channel region.

14. The device of claim 1, wherein the second transistor includes a surrounding gate structure.

15. The device of claim 1, wherein the second transistor is disposed on a surface of a semiconductor substrate.

16. The device of claim 1, wherein the first ferromagnetic layer and the first nonmagnetic layer are disposed over the wire.

17. The device of claim 1, wherein the first ferromagnetic layer includes CoFe.

18. The device of claim 1, wherein the first nonmagnetic layer includes Cu.

19. The device of claim 1, wherein at the time of the write operation, a magnetization orientation of the second ferromagnetic layer of the selected memory cell is reversed by spins accumulated in the first nonmagnetic layer by a current flowing between the first ferromagnetic layer and the first nonmagnetic layer.

* * * * *